(12) United States Patent
Ma et al.

(10) Patent No.: US 11,630,333 B2
(45) Date of Patent: Apr. 18, 2023

(54) DISPLAY PANEL AND DISPLAY DEVICE WITH BLOCKING METAL WIRE IN CONTROL UNIT

(71) Applicant: Shanghai Tianma Micro-Electronics Co., Ltd., Shanghai (CN)

(72) Inventors: Shaolong Ma, Shanghai (CN); Feng Lu, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 908 days.

(21) Appl. No.: 16/460,444

(22) Filed: Jul. 2, 2019

(65) Prior Publication Data

US 2020/0310168 A1    Oct. 1, 2020

(30) Foreign Application Priority Data

Mar. 29, 2019 (CN) .......................... 201910249763.2

(51) Int. Cl.
| | |
|---|---|
| *G02F 1/01* | (2006.01) |
| *H01L 27/12* | (2006.01) |
| *H01L 45/00* | (2006.01) |
| *G02F 1/13* | (2006.01) |
| *G09G 3/36* | (2006.01) |
| *G02F 1/1365* | (2006.01) |

(52) U.S. Cl.
CPC .......... *G02F 1/0147* (2013.01); *G02F 1/0121* (2013.01); *H01L 27/124* (2013.01); *G02F 1/132* (2013.01); *G02F 1/1365* (2013.01); *G02F 2203/02* (2013.01); *G09G 3/3603* (2013.01); *H01L 45/06* (2013.01)

(58) Field of Classification Search
CPC ...... G02F 1/0121; G02F 1/0147; G02F 1/132; G02F 2201/34; G02F 2203/02; G02F 2203/50

See application file for complete search history.

(56) References Cited

U.S. PATENT DOCUMENTS

| | | | |
|---|---|---|---|
| 2007/0159565 A1* | 7/2007 | Segawa | G02F 1/136209 257/E27.113 |
| 2021/0181544 A1* | 6/2021 | Hosseini | G02F 1/0147 |
| 2021/0231982 A1* | 7/2021 | Castillo | G02F 1/1365 |

FOREIGN PATENT DOCUMENTS

CN             108604022 A      9/2018

* cited by examiner

*Primary Examiner* — Paisley L Wilson
(74) *Attorney, Agent, or Firm* — Anova Law Group PLLC

(57) ABSTRACT

Display panel and display device are provided. The display panel includes a plurality of pixels and a blocking metal wire. The pixel includes a display unit and a control unit driving the display unit. The display unit at least includes a heating element and a phase change material layer. The heating element includes a first connecting terminal and a second connecting terminal. The control unit includes a first signal terminal and a second signal terminal. The control unit includes at least one diode, which includes a diode semiconductor layer including a first electrode contact region, a second electrode contact region and a connecting region. The blocking metal wire covers the connecting region and is insulated from the connecting region. The blocking metal wire is electrically connected to each of the first signal terminal and the first signal source or to each of the second connecting terminal and the second signal source.

18 Claims, 14 Drawing Sheets ically connected to each of the first signal terminal and the first signal source, or the blocking metal wire is electrically connected to each of the second connecting terminal and the second signal source.

Another aspect of the present disclosure provides a display device. The display device includes a display panel, including a plurality of pixels and the blocking metal wire. A pixel of the plurality of pixels includes a display unit and a control unit driving the display unit, and the display unit at least includes a heating element and a phase change material layer over the heating element. The heating element includes a first connecting terminal and a second connecting terminal. The control unit includes a first signal terminal and a second signal terminal. The first signal terminal is electrically connected to a first signal source, the second signal terminal is electrically connected to the first connecting terminal, and the second connecting terminal is electrically connected to a second signal source. The control unit includes at least one diode, and the diode includes a diode semiconductor layer including a first electrode contact region, a second electrode contact region and a connecting region between the first electrode contact region and the second electrode contact region. The blocking metal wire covers the connecting region in a direction perpendicular to the display panel and is insulated from the connecting region. The blocking metal wire is electrically connected to each of the first signal terminal and the first signal source, or the blocking metal wire is electrically connected to each of the second connecting terminal and the second signal source.

Other aspects of the present disclosure can be understood by those skilled in the art in light of the description, the claims, and the drawings of the present disclosure.

DISPLAY PANEL AND DISPLAY DEVICE WITH BLOCKING METAL WIRE IN CONTROL UNIT

CROSS-REFERENCE TO RELATED APPLICATION

This application claims the priority of Chinese Patent Application No. 201910249763.2, filed on Mar. 29, 2019, the content of which is incorporated herein by reference in its entirety.

TECHNICAL FIELD

The present disclosure generally relates to the field of display technology and, more particularly, relates to a display panel and a display device.

BACKGROUND

Conventional display technologies include liquid crystal displays, organic light-emitting displays, inorganic light-emitting displays, electronic paper, solid-state total reflection displays, etc. The solid-state total reflection displays utilize a phase change material to adjust the refractive index and/or absorbance of the phase change material by switching the phase change material between a crystalline state and an amorphous state. The solid-state total reflection display device does not need to be configured with a light source, but use ambient light as the light source to implement the display function by reflecting ambient light, where the adjustment of the ambient light reflectance is achieved by adjusting the refractive index and/or absorbance of the phase change material. After the phase change material completes the phase change, it is not necessary to continuously apply power to maintain the current state of the device, which may attract major manufacturers.

The solid-state total reflection displays as a display technology, the higher the resolution, the clearer the image display effect. Therefore, providing a display panel and a display device to enhance the display resolution of the solid-state total reflection may be a technical problem to be solved in the art.

SUMMARY

One aspect of the present disclosure provides a display panel. The display panel includes a plurality of pixels and a blocking metal wire. A pixel of the plurality of pixels includes a display unit and a control unit driving the display unit, and the display unit at least includes a heating element and a phase change material layer over the heating element. The heating element includes a first connecting terminal and a second connecting terminal. The control unit includes a first signal terminal and a second signal terminal. The first signal terminal is electrically connected to a first signal source, the second signal terminal is electrically connected to the first connecting terminal, and the second connecting terminal is electrically connected to a second signal source. The control unit includes at least one diode, and the diode includes a diode semiconductor layer including a first electrode contact region, a second electrode contact region and a connecting region between the first electrode contact region and the second electrode contact region. The blocking metal wire covers the connecting region in a direction perpendicular to the display panel and is insulated from the connecting region. The blocking metal wire is electr-

BRIEF DESCRIPTION OF THE DRAWINGS

The following drawings are merely examples for illustrative purposes according to various disclosed embodiments and are not intended to limit the scope of the present disclosure. Drawings incorporated in the specification and forming part of the specification demonstrate embodiments of the present disclosure and, together with the specification, describe the principles of the present disclosure.

DETAILED DESCRIPTION

Figure 1:
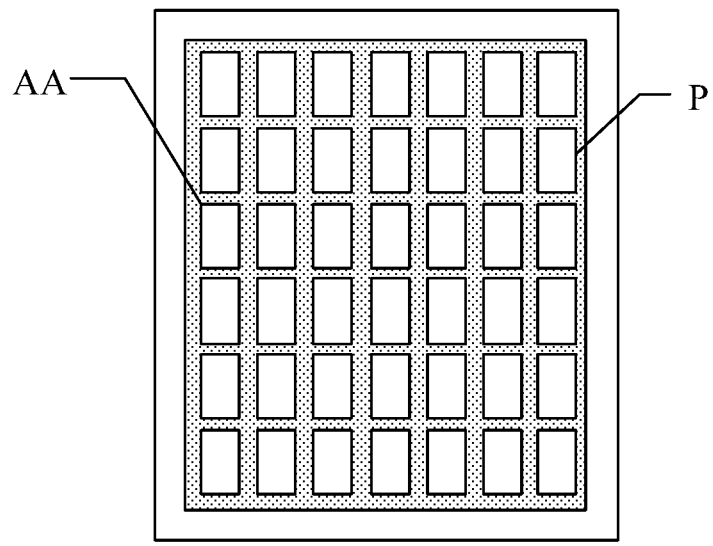
FIG. 1 illustrates a top-view schematic of an exemplary display panel according to embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

Various exemplary embodiments of the present disclosure will be described in detail with reference to the drawings. It should be noted that the relative arrangements of components and steps, numerical expressions and numerical values set forth in the embodiments are not intended to limit the scope of the present disclosure unless otherwise specified.

The following description of at least one exemplary embodiment is merely illustrative, and not as any limitations on the present disclosure and its application or use.

Techniques, methods and instruments known to those skilled in the art may not be discussed in detail, but where appropriate, the techniques, methods and instruments should be considered as part of the specification.

In all of the examples illustrated and discussed herein, any specific values should be construed as merely illustrative, and not as a limitation. Thus, other examples of the exemplary embodiments may have different values.

It should be noted that similar reference numerals and letters refer to similar items in the following figures, and therefore, once an item is defined in a figure, it is not required to be further discussed in the subsequent figures.

Figure 2:
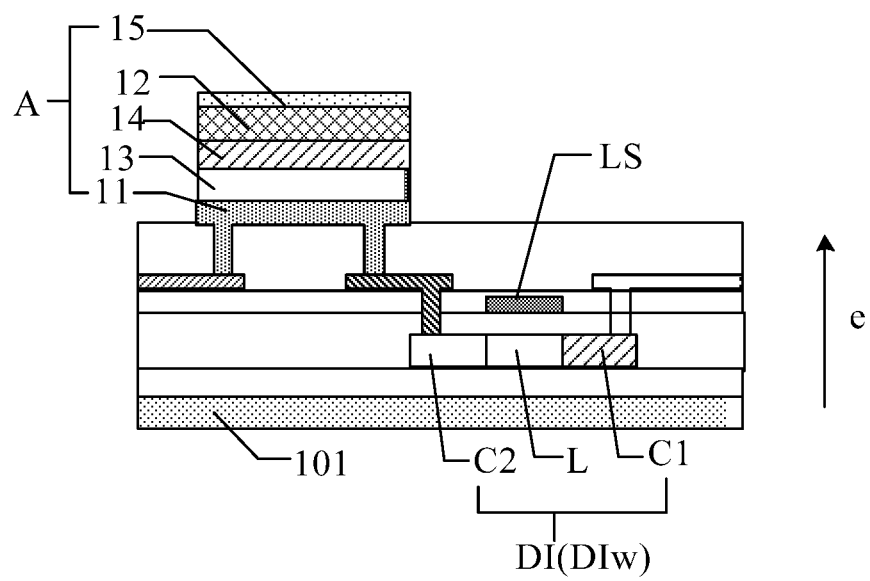
FIG. 2 illustrates a structural schematic of a film layer of a pixel in a display panel according embodiments of the present disclosure.
Figure 3:
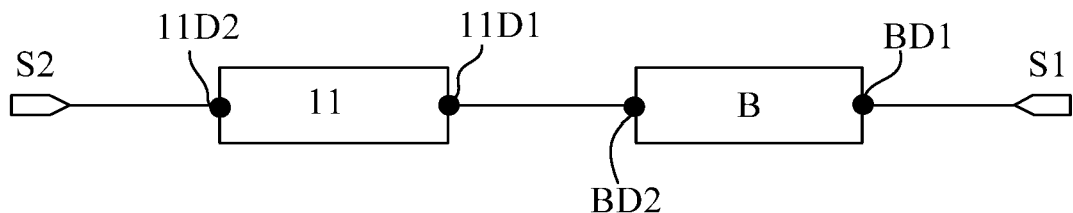
FIG. 3 illustrates a first schematic of the circuit connection of a heating element and a control unit according embodiments of the present disclosure.

FIG. 1 illustrates a top-view schematic of an exemplary display panel according to embodiments of the present disclosure. FIG. 2 illustrates a structural schematic of a film layer of a pixel in a display panel according embodiments of the present disclosure. FIG. 3 illustrates a first schematic of the circuit connection of a heating element and a control unit according embodiments of the present disclosure.

As shown in FIG. 1, a display panel may include a display region AA. A plurality of pixels P may be disposed in the display region AA. The pixels P in the display region AA may be arranged in an array illustrated in FIG. 1.

Referring to FIG. 2, the pixel P may include a display unit A and a control unit B driving the display unit A. The display panel may also include a substrate 101 and the pixel P may be disposed on the substrate 101. The display unit A may at least include a heating element 11 and a phase change material layer 12 disposed over the heating element 11. Optionally, the display unit A may further include a reflective layer 13 and a spacer layer 14 as shown in FIG. 2. The reflective layer 13 and the spacer layer 14 may be between the heating element 11 and the phase change material layer 12. The spacer layer 14 may be on a side of the reflective layer 13 away from the heating element 11. A capping layer 15 may be disposed on the phase change material layer 12. Both the reflective layer 13 and the spacer layer 14 may have thermal conductivity, and the spacer layer 14 may be capable of transmitting light. The refractive index of the fabricating material of the phase change material layer 12 may be reversibly switchable under a heating pulse. By adjusting a thickness of the spacer layer 14 to match the phase change material layer 12 and utilizing the characteristic that the reflectance varies with light wavelengths, the device optical characteristic for adjusting the reflective layer/the spacer layer/the phase change material layer may be implemented.

As shown in FIG. 3, the heating element 11 may include a first connecting terminal 11D1 and a second connecting terminal 11D2. The control unit B may include a first signal terminal BD1 and a second signal terminal BD2. The first signal terminal BD1 may be electrically connected to a first signal source S1. The second signal terminal BD2 may be electrically connected to the first connecting terminal 11D1. The second connecting terminal 11D2 may be electrically connected to a second signal source S2. In the present disclosure, the control unit B may be electrically connected to the heating element 11. After a current or voltage is applied to the heating element 11, the heating element 11 may be heated. When the heating element 11 is heated, heat may be quickly transferred to the phase change material layer 12 through the reflective layer 13 and the spacer layer 14 to heat the phase change material layer 12, which may enable the phase change material layer 12 to switch from one state to another state, thereby switching the reflective index.

The control unit B may include at least one diode DI, that is, the number of the diodes DI included in the control unit B in the present disclosure may not be limited. The control unit B may also include other elements than the diodes DI. Referring to FIG. 2, the diode DI may include a diode semiconductor layer DIw. The diode semiconductor layer DIw may include a first electrode contact region C1, a second electrode contact region C2 and a connecting region L between the first electrode contact region C1 and the second electrode contact region C2. The display panel may further include a blocking metal wire LS. The blocking metal wire LS may cover the connecting region L in a direction e perpendicular to the display panel. The blocking metal wire LS may be insulated from the connecting region L.

Figure 4:
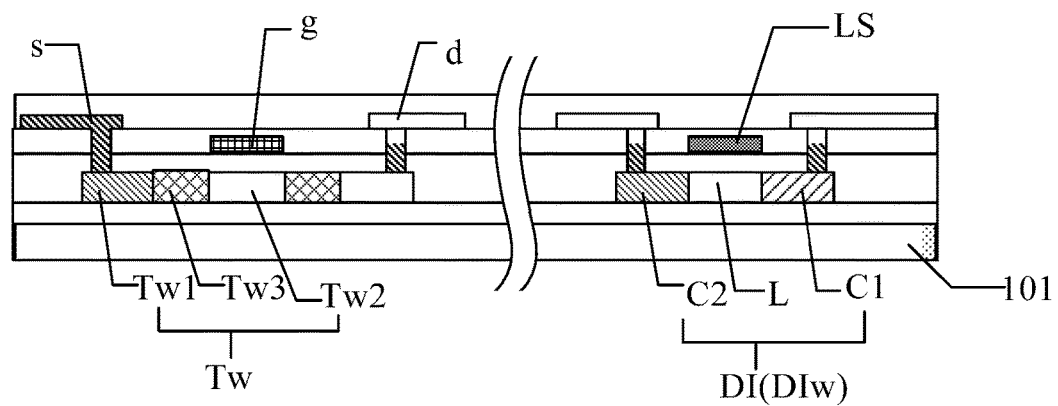
FIG. 4 illustrates a structural schematic of a film layer of a display panel of an optional embodiment according to the present disclosure.

The display panel provided by the present disclosure may further include switch transistors which may be used as switches in drive control circuits of the display panel. FIG. 4 illustrates a structural schematic of a film layer of a display panel of an optional embodiment according to the present disclosure. FIG. 4 may merely be used to illustrate that the display panel may include the switch transistors, but the positions of the switch transistors may not be limited. As shown in FIG. 4, the switch transistor T may include a transistor semiconductor layer Tw over the substrate 101, a gate g on a side of the transistor semiconductor layer Tw away from the substrate 101, and a source s and a drain d on a side of the gate g away from the transistor semiconductor layer. A plurality of insulating layers may be between the gate g and each of the source s and the drain d. In the manufacturing process of the display panel, the diodes DI may be multiplexed in the fabrication process of the switch transistor. For example, the diode semiconductor layer DIw and the transistor semiconductor layer Tw may be in the same film layer (i.e., the diode semiconductor layer DIw and the transistor semiconductor layer Tw may be the same material in the same layer, but not in contact with each other). The transistor semiconductor layer Tw may include an electrode region Tw1, a low doped region Tw2, and a channel region Tw3. The diode semiconductor layer DIw may include the first electrode contact region C1, the second electrode contact region C2 and the connecting region L. The connecting region L in the diode DI and the low doped region Tw2 of the switch transistor T may have different requirements on the element doping amount, where the low doped region Tw2, as a low doped drain region, may withstand a partial voltage and may prevent the thermal electron degradation effect. In order to avoid affecting the properties of the connecting region L when doping the low doped region Tw2 of the switch transistor T, the blocking metal wire LS may be fabricated over the connecting region L in the embodiments of the present disclosure.

Figure 5:
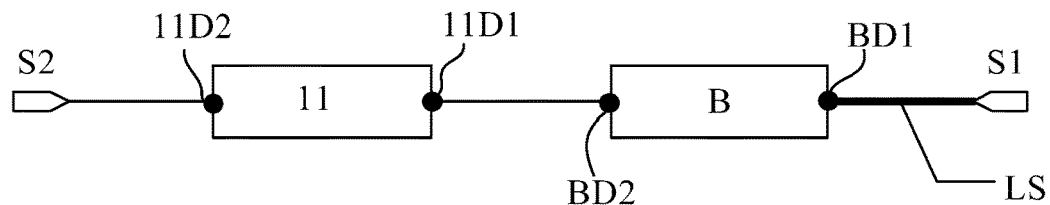
FIG. 5 illustrates a second schematic of the circuit connection of a heating element and a control unit according embodiments of the present disclosure.
Figure 6:
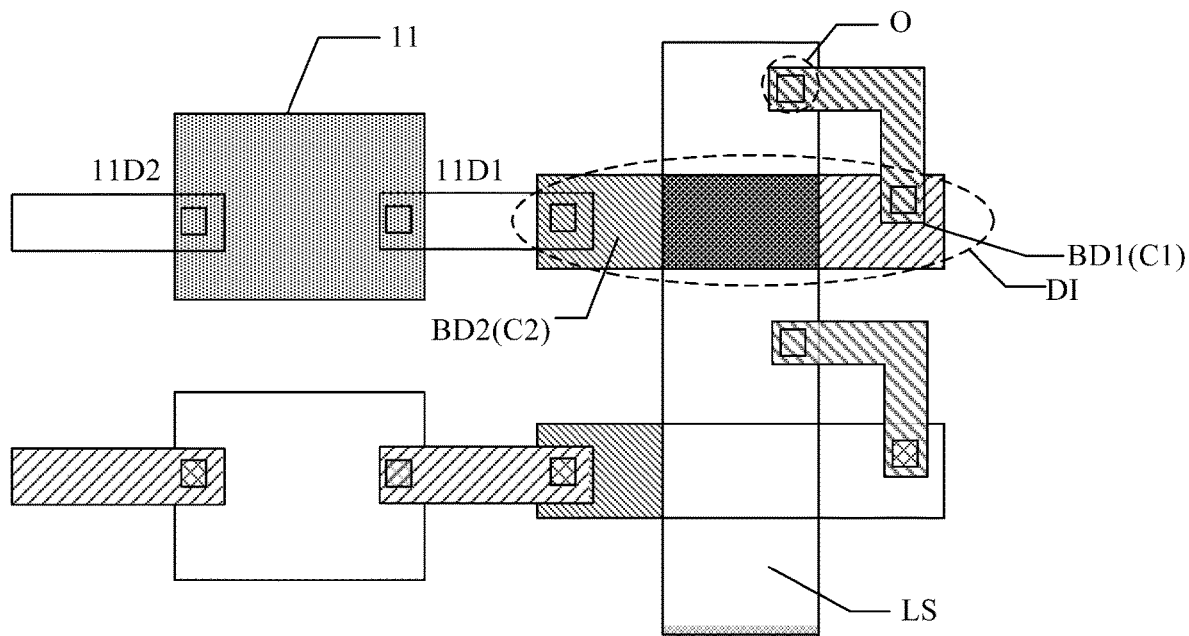
FIG. 6 illustrates a local schematic of a display panel of an optional embodiment corresponding to FIG. 5.

In the present disclosure, optionally, FIG. 5 illustrates a second schematic of the circuit connection of a heating element and a control unit according embodiments of the present disclosure. FIG. 6 illustrates a local schematic of a display panel of an optional embodiment corresponding to FIG. 5. As shown in FIG. 5, the blocking metal wire LS may be electrically connected to each of the first signal terminal BD1 and the first signal source S1. The first signal source S1 may be used to output the first signal. In such way, the blocking metal wire LS, as a connecting wire between the first signal terminal BD1 and the first signal source S1, may provide the first signal to the control unit B. The control unit B including only one diode DI may be illustrated in FIG. 6, where one end of the diode may be the first signal terminal BD1 and the other end of the diode may be the second signal terminal BD2. As shown in FIG. 6, the diode DI may be located in different film layers from both the blocking metal wire LS and the heating element 11. One end of the diode DI (e.g., the end of the first electrode contact region C1), as the first signal terminal BD1, may be connected to the blocking metal wire LS through a corresponding via O, and the other end of the diode DI (e.g., the end of the second electrode contact region C2), as the second signal terminal BD2, may be connected to the first connecting terminal 11D1 of the heating element 11 through a corresponding via O. Drive chips may be included in the display panel, and the signal source for driving the pixel display (the first signal source and the second signal source in the present disclosure) may be provided by the drive chips, so various metal wires led by the drive chips may be disposed in the display panel to provide the signal sources. In one embodiment, the blocking metal wire may be electrically connected to each of the first signal terminal and the first signal source, that is, the blocking metal wire may be multiplexed into the circuit wire for transmitting the first signal, and an additional circuit wire may not be required to be disposed in the display panel to transmit the first signal. Therefore, a number of the circuit wires disposed in the display panel may be reduced, which may be advantageous to save space occupied by the circuit wires in the display panel. The space saved may appropriately increase the number of pixels in the display panel, which may be advantageous to improve the display panel resolution.

Figure 7:
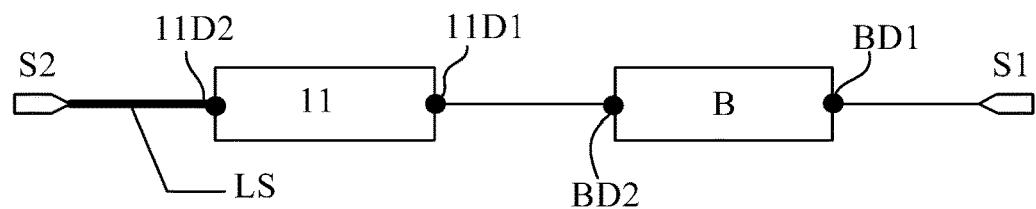
FIG. 7 illustrates a third schematic of the circuit connection of a heating element and a control unit according embodiments of the present disclosure.
Figure 8:
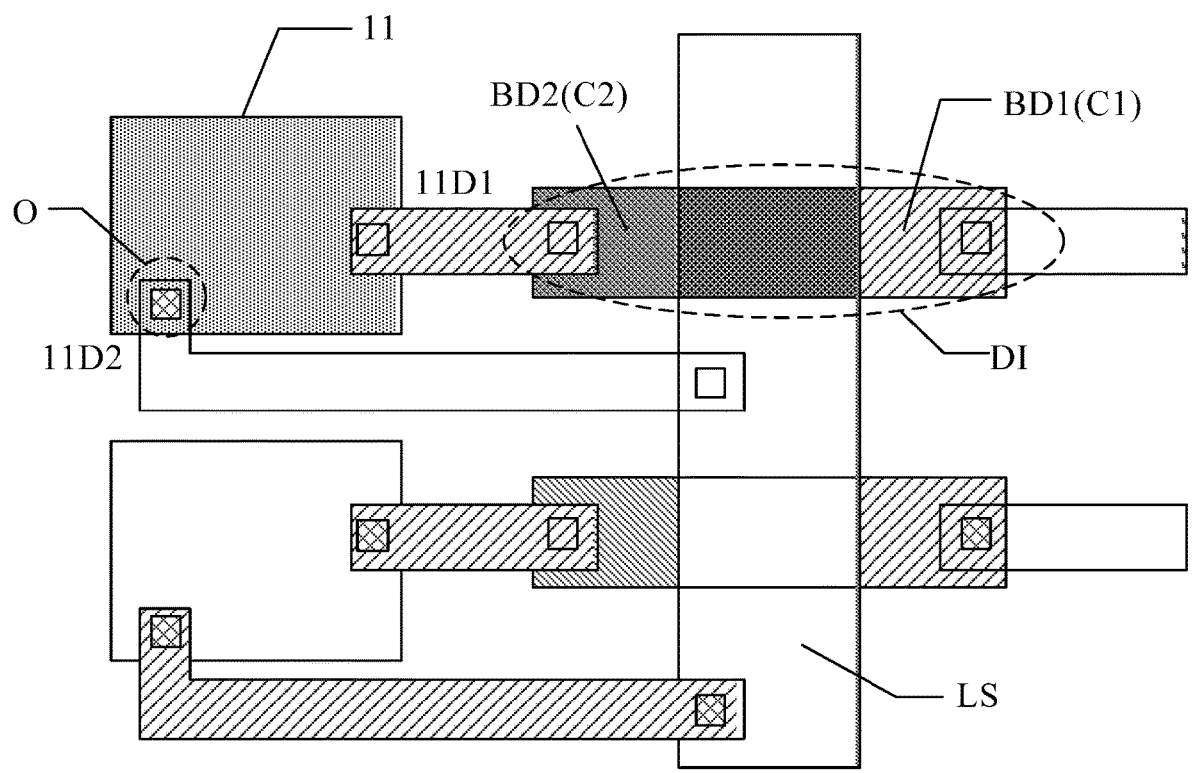
FIG. 8 illustrates a local schematic of a display panel of an optional embodiment corresponding to FIG. 7.

In one embodiment, optionally, FIG. 7 illustrates a third schematic of the circuit connection of a heating element and a control unit according embodiments of the present disclosure. FIG. 8 illustrates a local schematic of a display panel of an optional embodiment corresponding to FIG. 7. As shown in FIG. 7, the blocking metal wire LS may be electrically connected to each of the second connecting terminal 11D2 and the second signal source S2. The second signal source S2 may be used to output the second signal. In such way, the blocking metal wire LS, as a connecting wire between the second connecting terminal 11D2 and the second signal source S2, may provide the second signal to the heating unit 11. The control unit B including only one diode DI may be illustrated in FIG. 8, where one end of the diode may be the first signal terminal BD1 and the other end of the diode may be the second signal terminal BD2. As shown in FIG. 8, the diode DI may be located in different film layers from both the blocking metal wire LS and the heating element 11. The second connecting terminal 11D2 of the heating element 11 may be connected to the blocking metal wire LS through a corresponding via O. The first connecting terminal 11D1 of the heating element 11 may be connected to the end of the second electrode contact region C2 of the diode DI (the second signal terminal BD2). The end of the first electrode contact region C1 of the diode DI (the first signal terminal BD1) may be connected to the first signal source S1. In one embodiment, the blocking metal wire may be electrically connected to each of the second connecting terminal and the second signal source, that is, the blocking metal wire may be multiplexed into the circuit wire for transmitting the second signal, and additional circuit wires may not be required to be disposed in the display panel to transmit the second signal. Therefore, a number of the circuit wires disposed in the display panel may be reduced, which may be advantageous to save space occupied by the circuit wires in the display panel. The space saved may appropriately increase the number of pixels in the display panel, which may be advantageous to improve the display panel resolution.

It should be noted that FIG. 6 and FIG. 8 may merely be used to illustrate the electrical connection relationships between the blocking metal wire LS and the first signal terminal BD1 or the second signal terminal BD2. The relative positions of the elements and the wires in FIG. 6 and FIG. 8 may be merely illustrative and may not be intended to limit the present disclosure.

The display panel provided by the present disclosure may include the blocking metal wire. The blocking metal wire may be an insulated metal wire, which may be fabricated to overlap the connecting region and may ensure that the connecting region of the diode may not be affected by the doping process. In the present disclosure, the blocking metal wire may be electrically connected to each of the first signal terminal and the first signal source, or the blocking metal wire may be electrically connected to each of the second connecting terminal and the second signal source. The blocking metal wire may be multiplexed into the circuit wire for transmitting signals and a number of the circuit wires disposed in the display panel may be reduced, which may be advantageous to save space occupied by the circuit wires in the display panel. The space saved may appropriately increase the number of pixels in the display panel, which may be advantageous to improve the display panel resolution. Moreover, it may be only needed to adjust the design of a patterned template during the fabrication to implement the use of the blocking metal wire as the circuit wire for transmitting signals, where the process may be relatively simple.

In one embodiment, one end of the diode may be the first signal terminal and the other end may be the second signal terminal. That is, the control unit may only include one diode as a switch for controlling the display unit. The diode may provide a relatively large current or voltage during fabrication, so the large current or voltage may be provided to the heating element which may be rapidly heated. Furthermore, heat may be rapidly transferred to the phase change material layer, ensuring the switching speed between the different reflective indexes of the phase change material layer and avoiding the switching delay, which may improve the display effect of the display panel.

Figure 9:
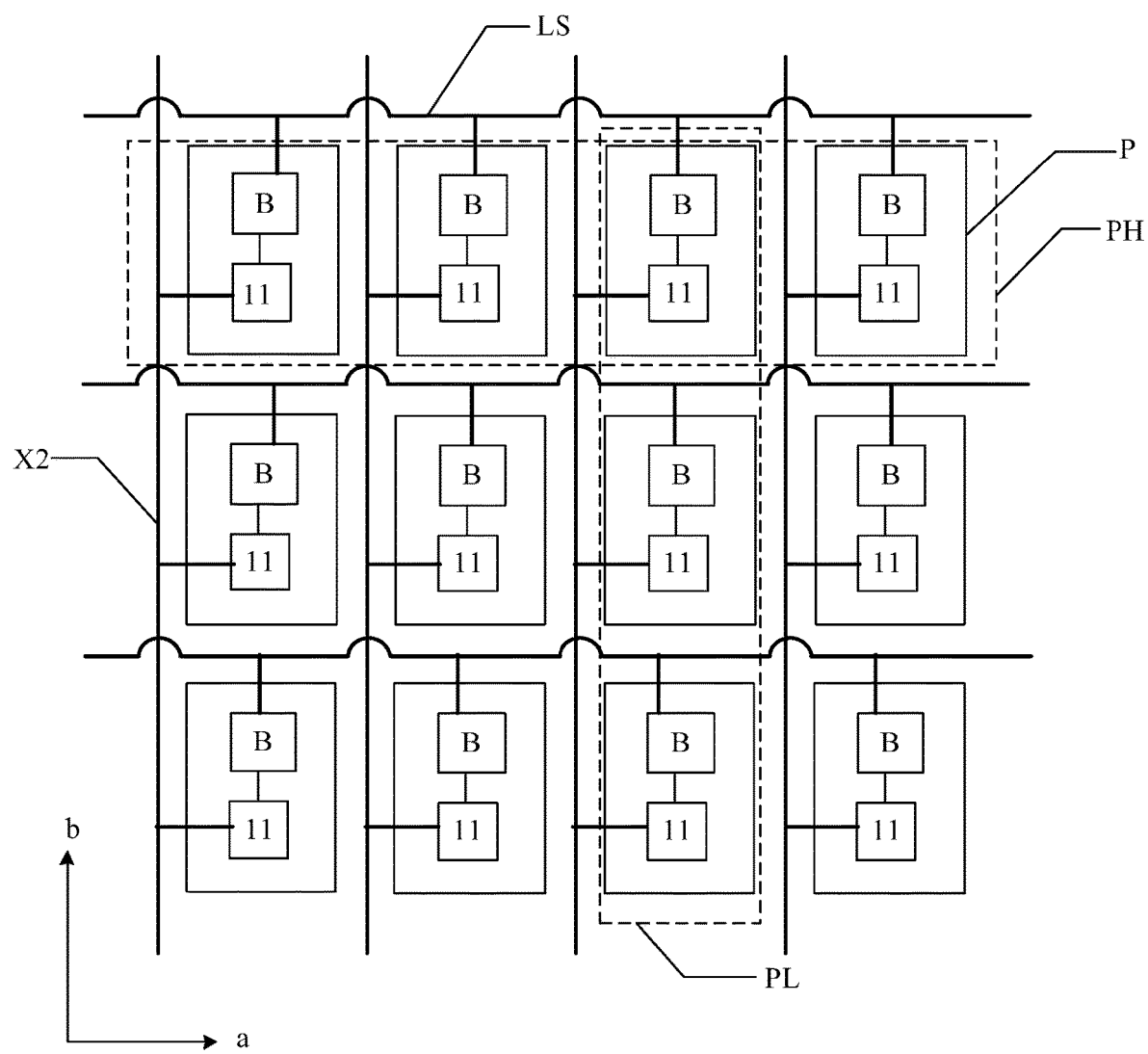
FIG. 9 illustrates a first schematic of a local simplified circuit of a display panel according embodiments of the present disclosure.

In one embodiment, FIG. 9 illustrates a first schematic of a local simplified circuit of a display panel according embodiments of the present disclosure. As shown in FIG. 9, the pixel P may include the display unit A and the control unit B, and only the heating unit 11 of the display unit A may be illustrated in FIG. 9. The control unit B may include at least on diode. The plurality of the pixels P may be arranged in a first direction a as a pixel row PH, and the plurality of the pixels P may be arranged in a second direction b as a pixel column PL, where the first direction a may intersect the second direction b. Optionally, the first direction a and the second direction b may be perpendicular to each other, and may be parallel to a plane of the display panel. The blocking metal wire LS may extend along the first direction a. The control units B of the plurality of the pixels P at the same pixel row PH may be electrically connected to a same blocking metal wire LS. The display panel may further include second signal lines X2 extending in the second direction b. The second connecting terminals of the heating elements 11 of the plurality of the pixels P in the same pixel column PL may be electrically connected to a same second signal line X2. In one embodiment, the blocking metal wire LS may be used to transmit the first signal to the control unit B, and the second signal line X2 may be used to transmit the second signal to the heating element. In one embodiment, during the fabrication process of the display panel, the blocking metal wire may prevent the connecting region of the diode from being affected by the doping process of the low-doped region of the switch transistor. Meanwhile, the blocking metal wire may be multiplexed into the circuit wire for transmitting the first signal and additional circuit wires may not be required to be disposed in the display panel to transmit the first signal. Therefore, a number of the circuit wires disposed in the display panel may be reduced, which may be advantageous to save space occupied by the circuit wires in the display panel. The space saved may appropriately increase the number of pixels in the display panel, which may be advantageous to improve the display panel resolution. It may be only needed to adjust the design of a patterned template during the fabrication to implement the use of the blocking metal wire as the circuit wire for transmitting signals, where the process may be relatively simple. In addition, an extending direction of the first signal line transmitting the first signal and an extending direction of the second signal line transmitting the second signal may intersect, so the first signal line and the second signal line may be needed to be fabricated in different film layers. In the present disclosure, the original blocking metal wire in the film structure may be multiplexed into the first signal line, which may be advantageous to reduce a thickness of the film layer of the display panel and a thickness of the display panel, and may also reduce the area occupied by the wires and save the space occupied by the display panel.

Figure 10:
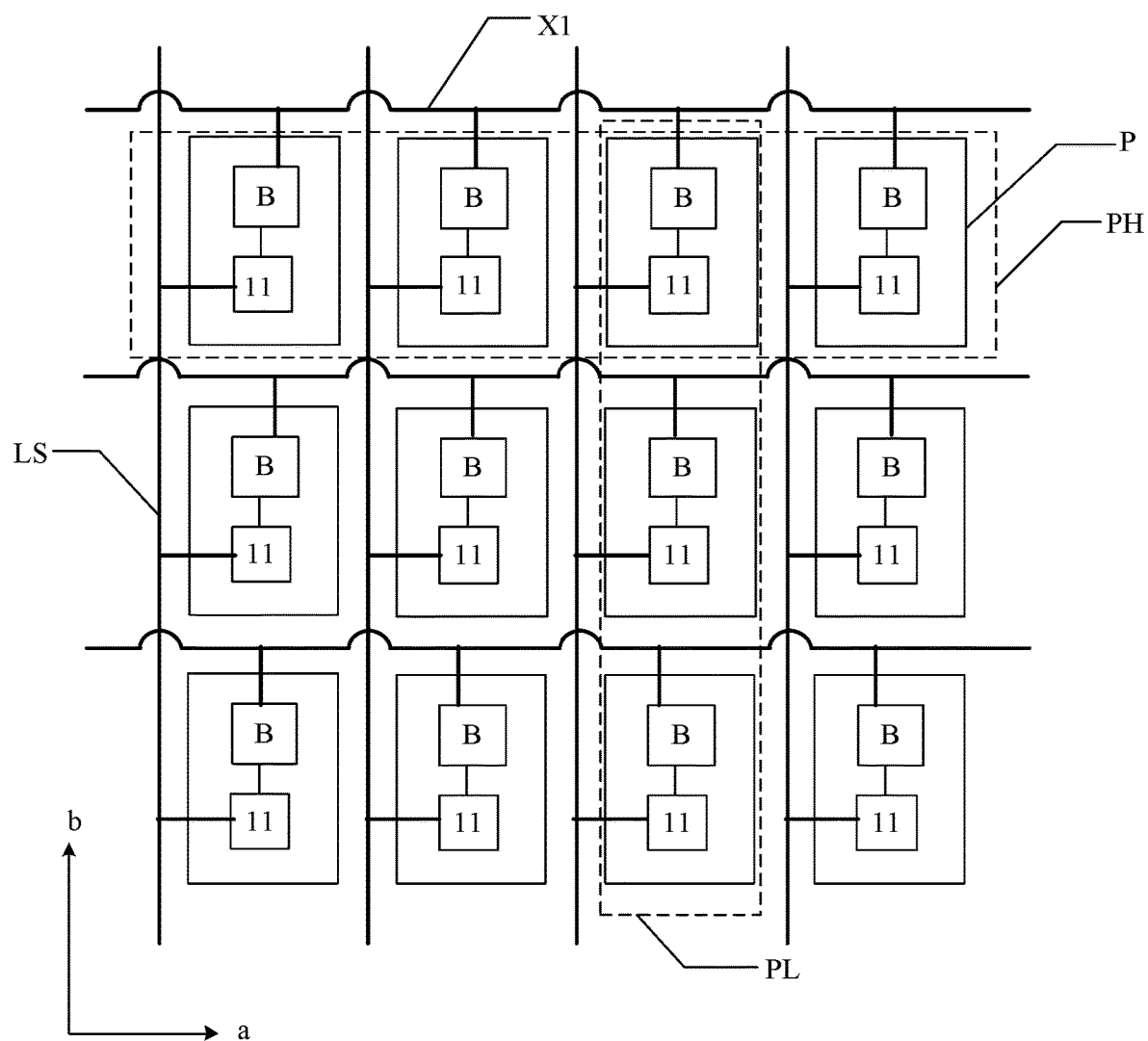
FIG. 10 illustrates a second schematic of a local simplified circuit of a display panel according embodiments of the present disclosure.

In one embodiment, FIG. 10 illustrates a second schematic of a local simplified circuit of a display panel according embodiments of the present disclosure. As shown in FIG. 10, the pixel P may include the display unit A and the control unit B, and only the heating unit 11 of the display unit A may be illustrated in FIG. 10. The control unit B may include at least on diode. The plurality of the pixels P may be arranged in a first direction a as the pixel row PH, and the plurality of the pixels P may be arranged in a second direction b as the pixel column PL, where the first direction a may intersect the second direction b. The display panel may further include first signal lines X1 extending in the first direction a. The control units B of the plurality of the pixels P in the same pixel row PH may be electrically connected to a same first signal line X1. The blocking metal wire LS may extend along the second direction b. The second connecting terminals of the heating elements 11 of the plurality of the pixels P at the same pixel column PL may be electrically connected to a same blocking metal wire LS. In one embodiment, the blocking metal wire LS may be used to transmit the second signal to the heating element 11, and the first signal line X1 may be used to transmit the first signal to the control unit B. During the fabrication process of the display panel, the blocking metal wire may prevent the connecting region of the diode from being affected by the doping process of the low-doped region of the switch transistor. Meanwhile, the blocking metal wire may be multiplexed into the circuit wire for transmitting the second signal and additional circuit wires may not be required to be disposed in the display panel to transmit the second signal. Therefore, a number of the circuit wires disposed in the display panel may be reduced, which may be advantageous to save space occupied by the circuit wires in the display panel and to improve the display panel resolution. It may be only needed to adjust the design of the patterned template during the fabrication to implement the use of the blocking metal wire as the circuit wire for transmitting signals, where the process may be relatively simple. In addition, the extending direction of the first signal line transmitting the first signal and the extending direction of the second signal line transmitting the second signal may intersect, so the first signal line and the second signal line may be needed to be fabricated in different film layers. In the present disclosure, the original blocking metal wire in the film structure may be multiplexed into the second signal line, which may be advantageous to reduce the thickness of the film layer of the display panel and the thickness of the display panel.

Figure 11:
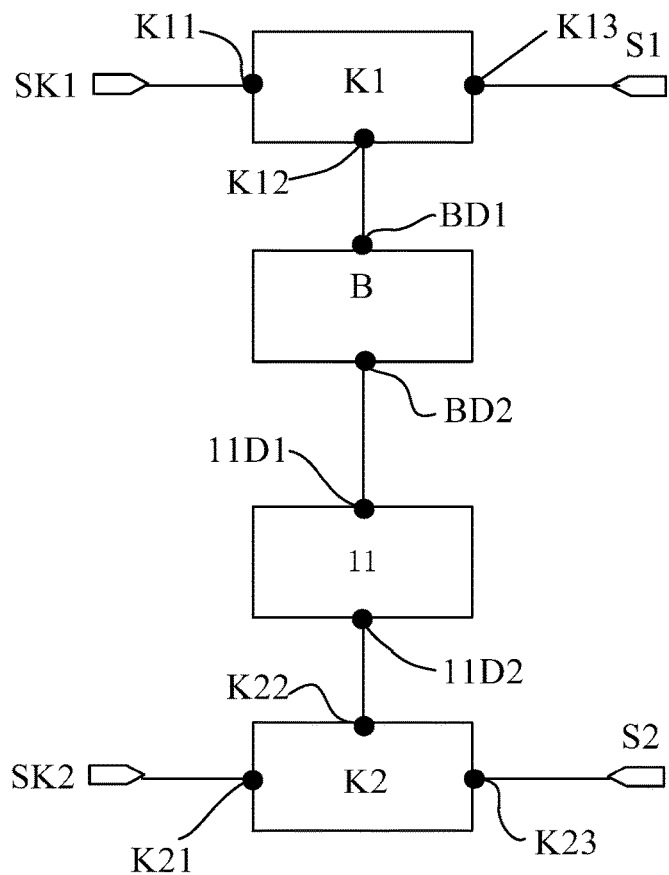
FIG. 11 illustrates a third schematic of a local simplified circuit of a display panel according embodiments of the present disclosure.

In one embodiment, FIG. 11 illustrates a third schematic of a local simplified circuit of a display panel according embodiments of the present disclosure. As shown in FIG. 11, a circuit controlling one pixel may be used as example. The pixel P may include the display unit A and the control unit B, and only the heating unit 11 of the display unit A may be illustrated in FIG. 11. The heating element 11 may include the first connecting terminal 11D1 and the second connecting terminal 11D2. The control unit B may include the first signal terminal BD1 and the second signal terminal BD2. The display panel may also include switch units. The switch units may include a first switch unit K1 and a second switch unit K2. A control terminal K11 of the first switch unit K1 may be electrically connected to a first switch signal source SKI. A first terminal K12 of the first switch unit K1 may be electrically connected to the first signal terminal BD1. A second terminal K13 of the first switch unit K1 may be electrically connected to the first signal source S1. A control terminal K21 of the second switch unit K2 may be electrically connected to a second switch signal source SK2. A first terminal K22 of the second switch unit K2 may be electrically connected to the second connecting terminal 11D2. A second terminal K23 of the second switch unit K2 may be electrically connected to the second signal source S2. In one embodiment, the first switch unit K1 may be configured to input the first signal (provided by the first signal source S1) to the control unit B. When the first switch signal source SK1 provides an effective level signal to the control terminal K11, the first switch unit K1 may be turned on, and the first signal provided by the first signal source S1 may be transmitted to the first signal terminal BD1 of the control unit B through the second terminal K13 and the first terminal K12, and then the first signal may be transmitted to the first connecting terminal 11D1 of the heating element 11 through the second signal terminal BD1. The second switch unit K2 may be configured to input the second signal (provided by the second signal source S2) to the heating element 11. When the second switch signal source SK2 provides an effective level signal to the control terminal K21, the second switch unit K2 may be turned on, and the second signal provided by the second signal source S2 may be transmitted to the second connecting terminal 11D2 of the heating element 11 through the second terminal K23 and the first terminal K22; thereby applying voltage signals on both terminals of the heating element 11 and heating the heating element 11. When the heating element 11 is heated, heat may be quickly transferred to the phase change material layer through the reflective layer and the spacer layer to heat the phase change material layer, and the phase change material layer may be controlled to switch from one state to another state, thereby switching the reflective indexes. In one embodiment, the blocking metal wire may be multiplexed into the circuit wire for transmitting signals in the display panel, which may reduce a number of the circuit wires disposed in the display panel and improve the display panel resolution. In addition, it may be only needed to adjust the design of the patterned template during the fabrication to implement the use of the blocking metal wire as the circuit wire for transmitting signals, where the process may be relatively simple. On the basis of the above-mentioned embodiments, the corresponding switch units may be respectively added between the first signal source S1 and the second signal source S2 simultaneously, so the first signal source S1 and the second signal source S2 may be prevented from being powered for a long time, which may affect power consumption and the life time of each element. In one embodiment, the first signal and the second signal may be respectively provided to the pixels after the switch units receive the effective level signal, which may be more reasonable in design and be advantageous to reduce power consumption.

Figure 12:
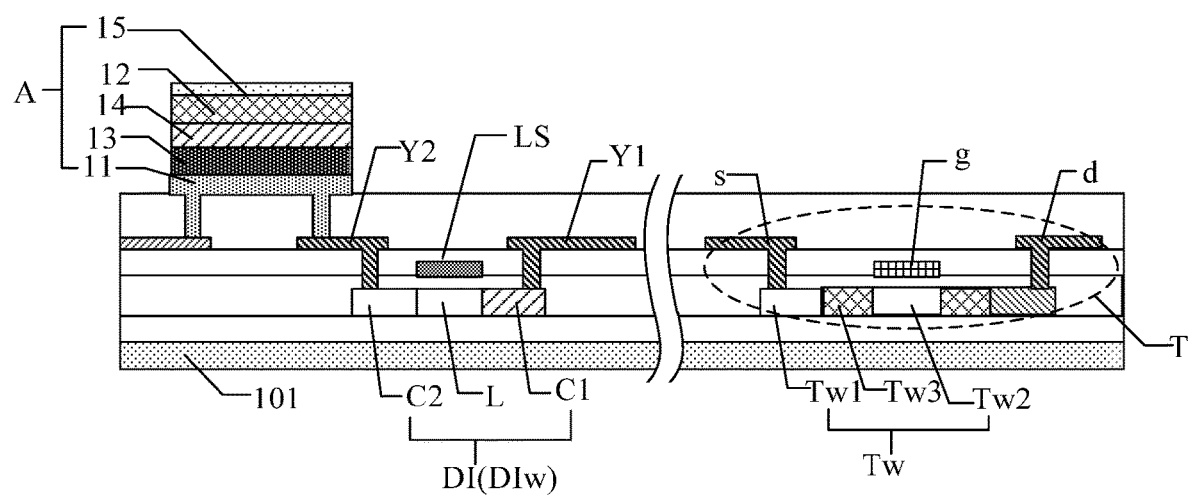
FIG. 12 illustrates a structural schematic of a film layer of a display panel of another optional embodiment according to the present disclosure.

In one embodiment, FIG. 12 illustrates a structural schematic of a film layer of a display panel of another optional embodiment according to the present disclosure. As shown in FIG. 12, the display panel may include the substrate 101. One switch unit K may include at least one switch transistor T. The switch transistor T may include the transistor semiconductor layer Tw over the substrate 101, the gate g on the side of the transistor semiconductor layer Tw away from the substrate 101, and the source s and the drain d on the side of the gate g away from the transistor semiconductor layer Tw. The diode DI may further include a first electrode Y1 and a second electrode Y2. The first electrode Y1 may be electrically connected to the first electrode contact region C1, and the second electrode Y2 may be electrically connected to the second electrode contact region C2. The first electrode Y1 and the second electrode Y2 may be on the side of the diode semiconductor layer DIw away from the substrate 101. The transistor semiconductor layer Tw and the diode semiconductor layer DIw of at least one switch transistor T may be in a same film layer. The first electrode Yl, the second electrode Y2, the source s and the drain d may be in a same film layer. The blocking metal wire LS and the gate g may be in a same film layer. As shown in FIG. 12, the transistor semiconductor layer Tw may include the electrode region Tw1, the low doped region Tw2, and the channel region Tw3. The diode semiconductor layer DIw may include the first electrode contact region C1, the second electrode contact region C2 and the connecting region L. The connecting region L in the diode DI and the low doped region Tw2 of the switch transistor T may have different requirements on the element doping amount, where the low doped region Tw2, as a low doped drain region, may withstand a partial voltage and may prevent the thermal electron degradation effect. In order to avoid affecting the properties of the connecting region L when doping the low doped region Tw2 of the switch transistor T, the blocking metal wire LS may be required over the connecting region L. In one embodiment, the blocking metal wire and the gate may be fabricated in the same etching process, so it is not required to fabricate the blocking metal wire separately using an additional process, and the process may be relatively simple. The diode semiconductor layer and the transistor semiconductor layer may be fabricated in the same etching process. The first electrode, the second electrode, the source and the drain may be fabricated in the same etching process, that is, the process of the switch transistor may be multiplexed into the diode fabrication, and the process may be relatively simple. Meanwhile, in one embodiment, the blocking metal wire may be multiplexed into the circuit wire for transmitting signals and the number of the circuit wires disposed in the display panel may be reduced, which may be advantageous to save space occupied by the circuit wires in the display panel. The space saved may appropriately increase the number of pixels in the display panel, which may be advantageous to improve the display panel resolution.

Figure 13:
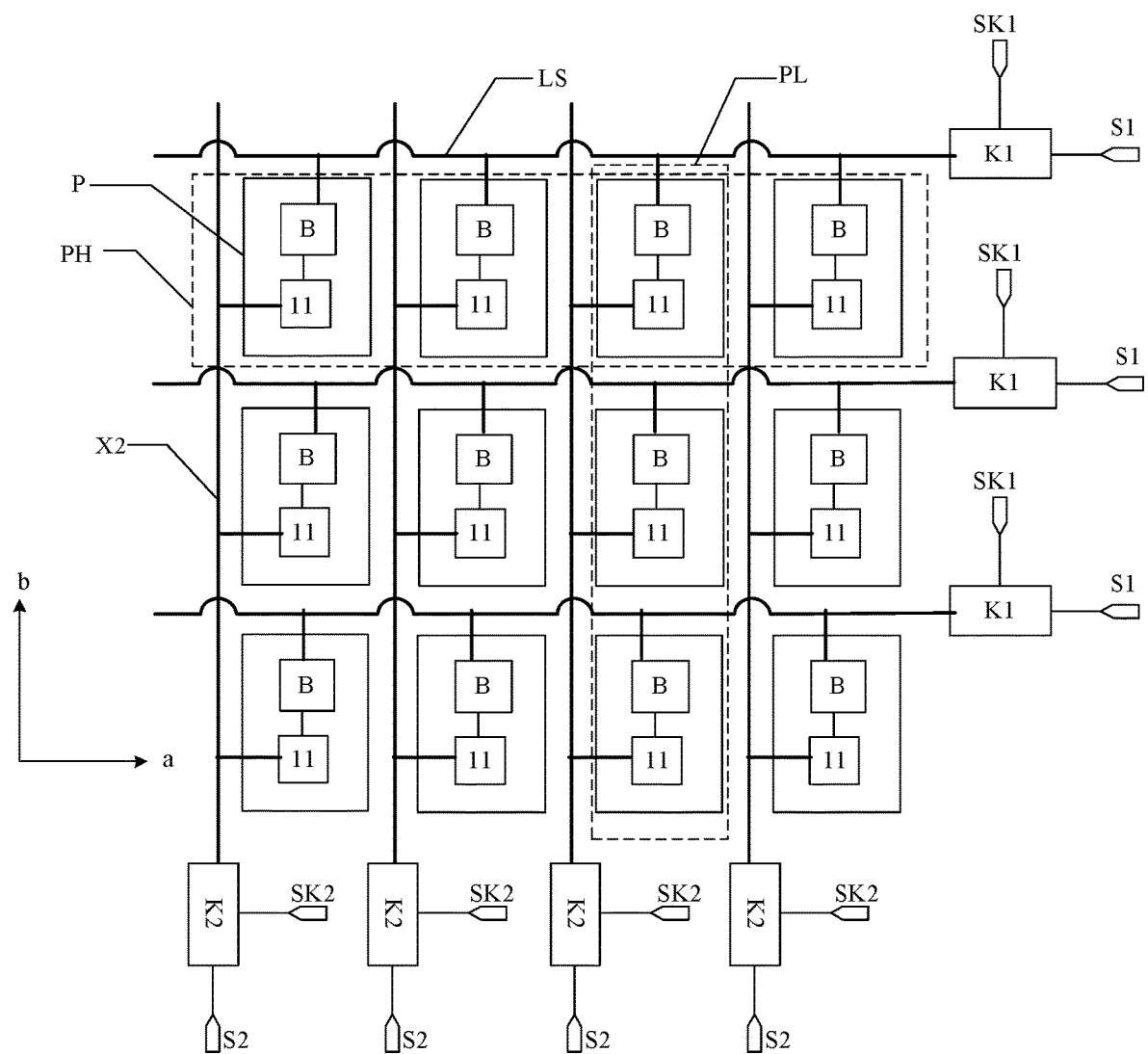
FIG. 13 illustrates a fourth schematic of a local simplified circuit of a display panel according embodiments of the present disclosure.

In one embodiment, FIG. 13 illustrates a fourth schematic of a local simplified circuit of a display panel according embodiments of the present disclosure. As shown in FIG. 13, The plurality of the pixels P may be arranged in the first direction a as the pixel row PH, and the plurality of the pixels P may be arranged in the second direction b as the pixel column PL, where the first direction a may intersect the second direction b. The first signal terminals of the control units B of the plurality of the pixels P in the same pixel row PH may be electrically connected to the same first switch unit K1. The second connecting terminals of the heating elements 11 of the plurality of the pixels P at the same pixel column PL may be electrically connected to the same second switch unit K2. In one embodiment, the blocking metal wire may be multiplexed into the circuit wire for transmitting signals in the display panel (FIG. 13 may be the circuit wire of the control unit B for transmitting the first signal), and a number of the circuit wires disposed in the display panel may be reduced, which may be advantageous to improve the display panel resolution. Meanwhile, it may be only needed to adjust the design of a patterned template during the fabrication to implement the use of the blocking metal wire as the circuit wire for transmitting signals, where the process may be relatively simple. In addition, the corresponding switch units may be respectively added between the first signal source S1 and the second signal source S2, so the first signal source S1 and the second signal source S2 may be prevented from being powered for a long time, which may affect power consumption. Furthermore, the first switch unit may be electrically connected to the control units of the plurality of pixels of the same pixel row, and the first signal may be simultaneously input to the plurality of control units of the plurality of pixels in the same row after the first switch unit is turned on. The second switch unit may be electrically connected to the heating units of the plurality of pixels of the same pixel column, and the second signal may be simultaneously input to the plurality of heating units of the plurality of pixels in the same row after the second switch unit is turned on. There may be no need to separately configure the first switch unit and the second switch unit for each pixel, and which may reduce the number of the configured switch units to a certain extent and may be advantageous to save space of the display panel; and one switch unit may control one row or one column of pixels, and the control method may be simpler.

In some embodiments, the display panel may include control lines and signal buses. The control lines may include first control lines and second control lines, and the signal buses may include row signal buses and column signal buses. The control terminal of the first switch unit may be connected to the first control line, and the second terminal of the first switch unit may be connected to the row signal bus. The control terminal of the second switch unit may be connected to the second control line, and the second terminal of the second switch unit may be connected to the column signal bus.

Figure 14:
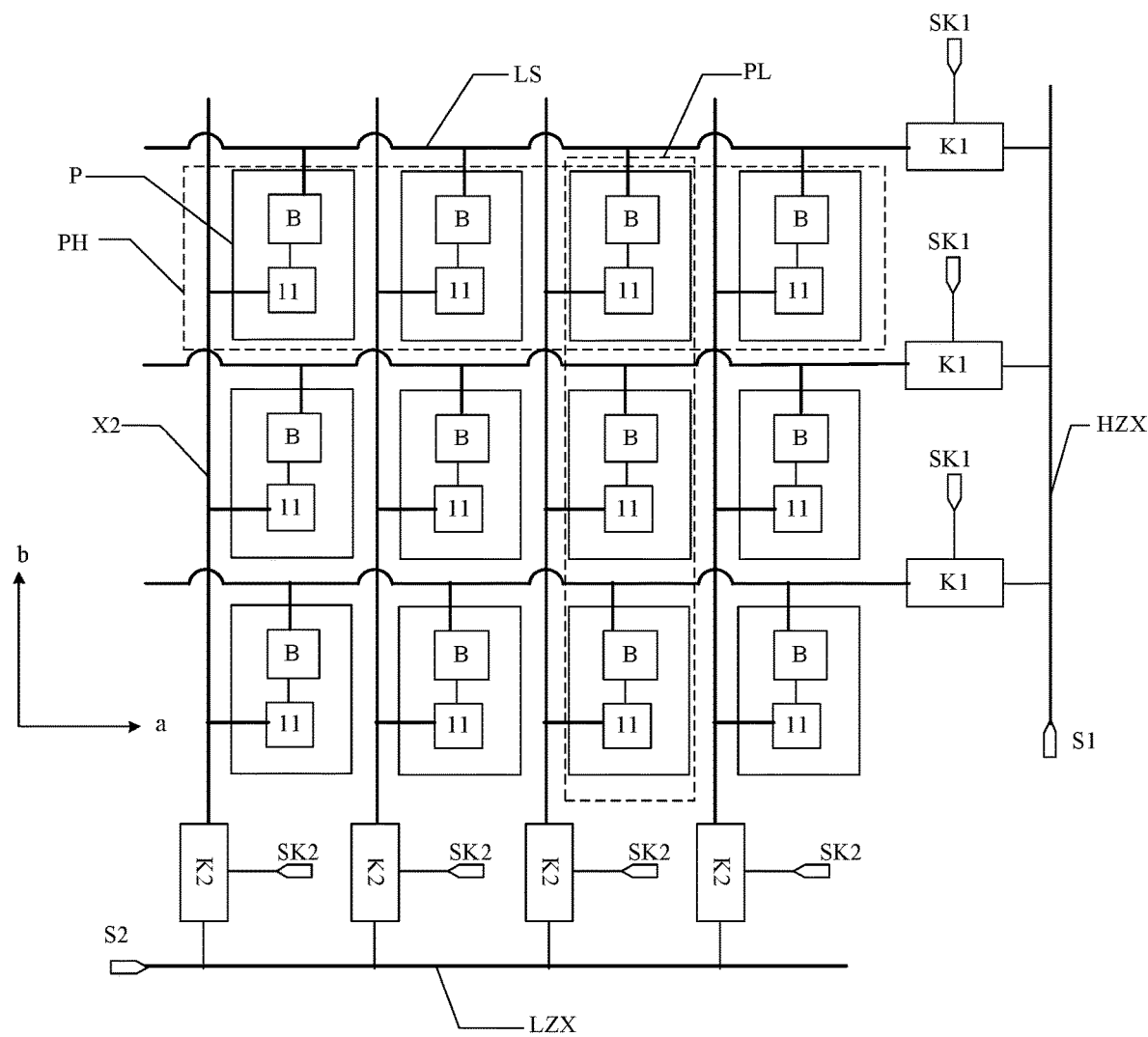
FIG. 14 illustrates a fifth schematic of a local simplified circuit of a display panel according embodiments of the present disclosure.

Optionally, FIG. 14 illustrates a fifth schematic of a local simplified circuit of a display panel according embodiments of the present disclosure. As shown in FIG. 14, the second terminals (the terminals connected to the first signal source S1) of all the first switch units K1 may be connected to a same row signal bus HZX, and the second terminals (the terminals connected to the second signal source S2) of all the second switch units K2 may be connected to a same column signal bus LZX. In one embodiment, based on the embodiment of FIG. 13, the second terminals of all the first switch units may be further connected to the same row signal bus. When controlling the display function of the display panel, the row signal bus may input the first signal chronologically and may cooperate with the control signal input by the control terminals of the first switch units, which may implement transmitting the first signal to the first signal line (corresponding to the blocking metal wire LS in FIG. 14). The second terminals of all the second switch units may be further connected to the same column signal bus. When controlling the display function of the display panel, the column signal bus may input the second signal chronologically and may cooperate with the control signal input by the control terminals of the second switch units, which may implement transmitting the second signal to the second signal line. In one embodiment, only one row signal bus and one column signal bus need to be configured to transmit the signals to all the first signal lines and all the second signal lines, and the number of the signal buses may be less configured in the display panel, which may be advantageous to save the space occupied by the circuit buses.

Figure 15:
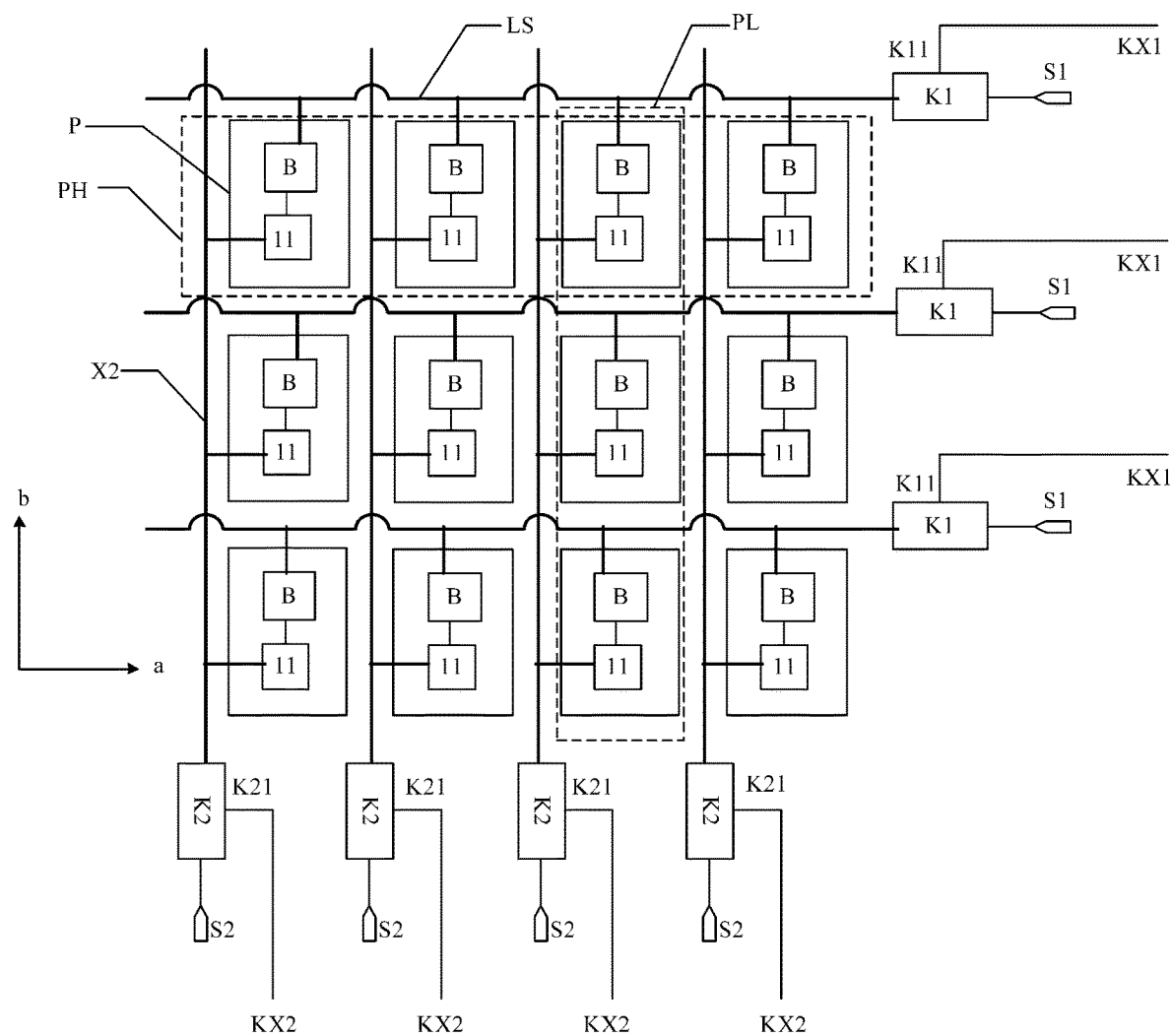
FIG. 15 illustrates a sixth schematic of a local simplified circuit of a display panel according embodiments of the present disclosure.

Optionally, FIG. 15 illustrates a sixth schematic of a local simplified circuit of a display panel according embodiments of the present disclosure. As shown in FIG. 15, based on the embodiment of FIG. 13, the control terminal K11 of each first switch unit K1 may be further connected to a different first control line KX1 and the control terminal K21 of each second switch unit K2 may be further connected to a different second control line KX2 in one embodiment. In such way, the separate control of each first switch unit and each second switch unit may be implemented, and the degree of freedom of drive control may be greater when the display panel is driven to display.

Figure 16:
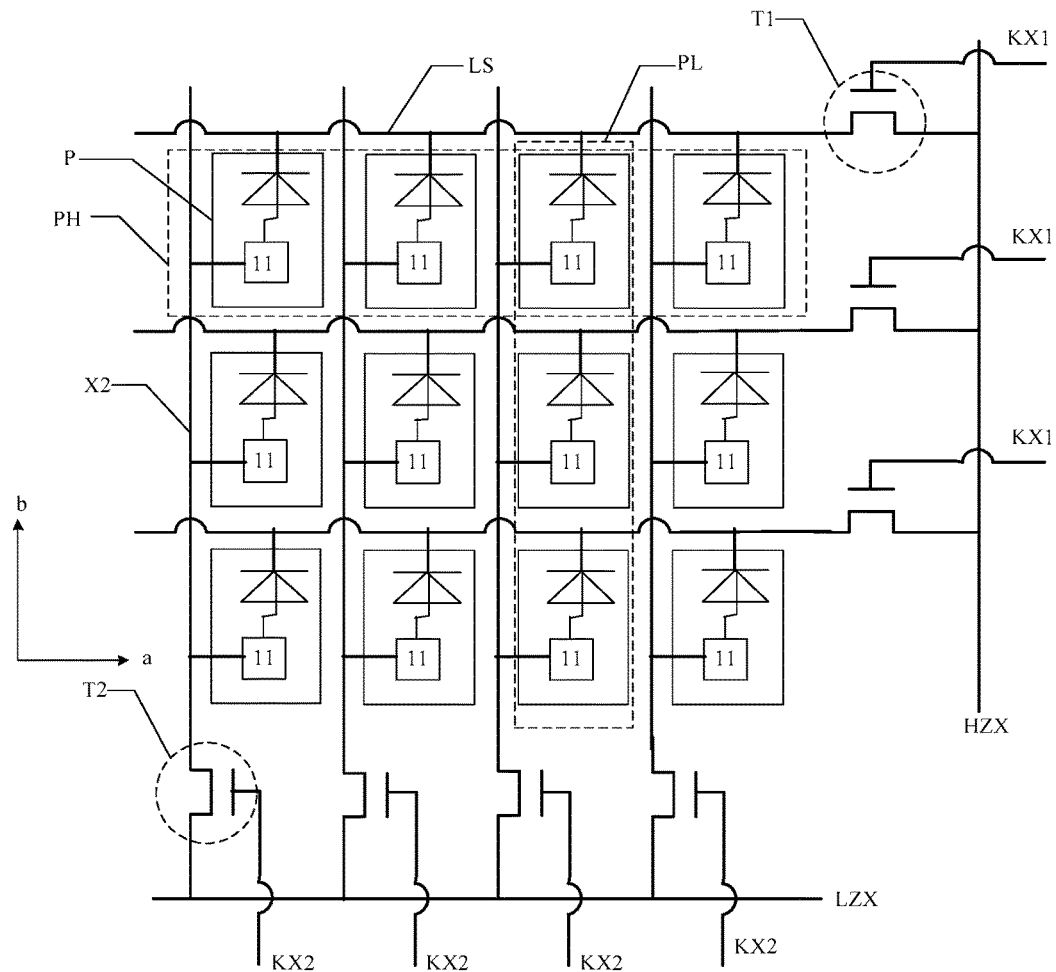
FIG. 16 illustrates a seventh schematic of a local simplified circuit of a display panel according embodiments of the present disclosure.

In one embodiment, the control unit may include one diode. One end of the diode is the first signal terminal and the other end is the second signal terminal. The switch unit may include one switch transistor as an example. FIG. 16 illustrates a seventh schematic of a local simplified circuit of a display panel according embodiments of the present disclosure. As shown in FIG. 16, the first switch unit may include the first switch transistor T1, and the second switch unit may include the second switch transistor T2. All the second terminals of the first switch transistors T1 may be connected to the same row signal bus HZX, and all the second terminals of the second switch transistors T2 may be connected to the same column signal bus LZX. Each control terminal of the first switch transistor T1 may be connected to the different first control line KX1, and each control terminal of the second switch transistor T2 may be connected to the different second control line KX2. In one embodiment, using the diode as the control unit of the display unit, the diode may provide a relatively large current or voltage, so the large current or voltage may be provided to the heating element which may be rapidly heated. Furthermore, heat may be rapidly transferred to the phase change material layer, ensuring the switching speed between the different reflective indexes of the phase change material layer and avoiding the switching delay, which may improve the display effect of the display panel. Meanwhile, the blocking metal wire may be multiplexed into the circuit wire for transmitting signals (multiplexed into the first signal line for transmitting the first signal in FIG. 16), which may reduce the number of the circuit wires configured in the display panel, thereby saving the space occupied by the circuit wires. Then, the first switch transistor may be connected to the first signal line, and the second switch transistor may be connected to the second signal line. The switch transistors may be used as the switch units of the first signal line and the second signal line, and the control method may be simple.

It should be noted that the embodiments corresponding to FIGS. 13-16 are all illustrated by the circuit structure shown in FIG. 9, and the above-mentioned embodiments are also applicable to the circuit structure shown in FIG. 10, which may not be described in detail herein. In addition, the structures of the first switch unit K1 and the second switch unit K2 in the above-mentioned embodiments corresponding to FIGS. 13-16 may be the same as the structure of the switch transistor T illustrated in FIG. 4. The transistor semiconductor layer Tw of the first switch unit K1 and the second switch unit K2 in the display panel may be in the same film layer as the diode semiconductor layer DIw. The gate g of the first switch unit K1 and the second switch unit K2 may be in the same film layer as the blocking metal wire LS in the present disclosure.

Figure 17:
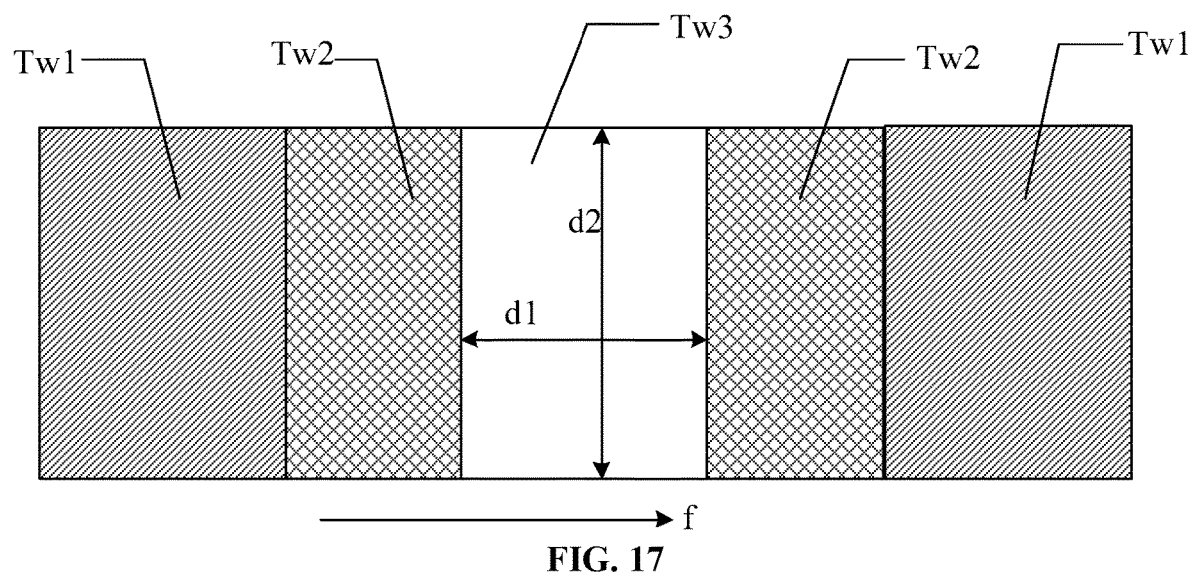
FIG. 17 illustrates a top-view structural schematic of a switch transistor according to embodiments of the present disclosure.

Optionally, FIG. 17 illustrates a top-view structural schematic of a switch transistor according to embodiments of the present disclosure. The transistor semiconductor layer Tw in the switch transistor may be illustrated in FIG. 17. The transistor semiconductor layer Tw may include the electrode regions Tw1, the low doped regions Tw2 and the channel region Tw3 shown in FIG. 17. The two low doped regions Tw2 may be located on both sides of the channel region Tw3, and the electrode region Tw1 may be adjacent to the low doped regions Tw2. A direction f from one electrode region to the other electrode region is a length direction of the channel region, and the length of the channel region is d1. A direction perpendicular to the direction f is a width direction of the channel region, and the width of the channel region is d2. A width to length ratio of the channel region of the switch transistor is m, where $m=d2/d1$ and $m \geq 10$. The on-current of the switch transistor at the on-mode may be related to the width to length ratio of the channel region of the switch transistor. In the present disclosure, the width to length ratio of the channel region of the switch transistor may be set to be $m \geq 10$, that is, the width to length ratio may be relatively large, which may ensure a large on-current of the switch transistor at the on-mode and further satisfy the first signal having a large on-current. Therefore, it may ensure that the relatively large current may be provided to the heating element of the display unit, and the heating element may be ensured to be rapidly heated. Furthermore, heat may be rapidly transferred to the phase change material layer, ensuring the switching speed between the different reflective indexes of the phase change material layer and avoiding the switching delay, which may improve the display effect of the display panel.

Figure 18:
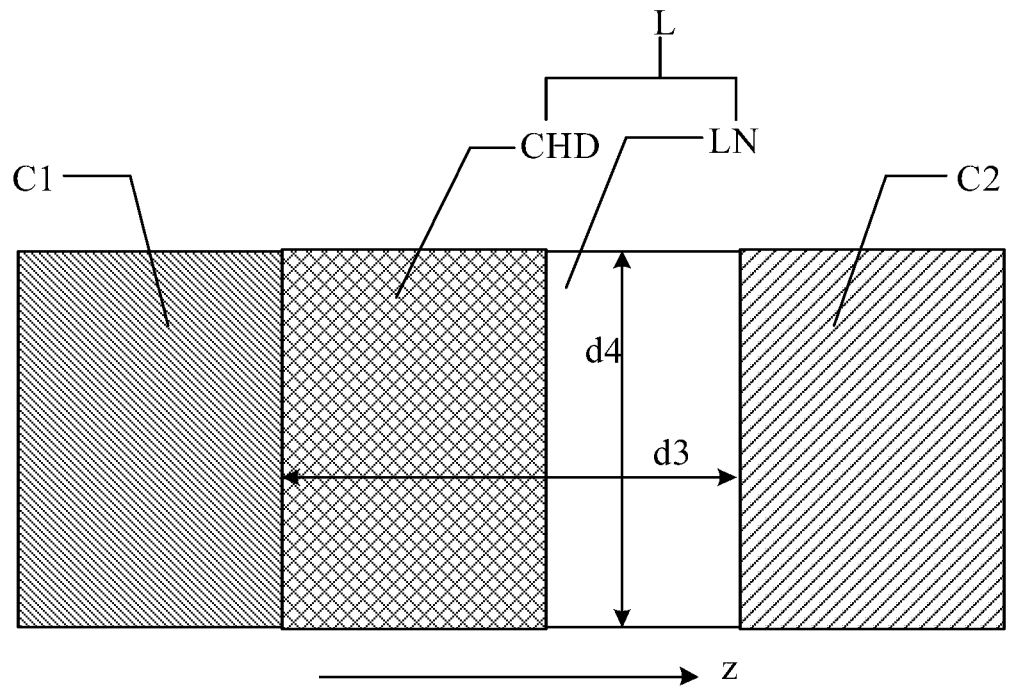
FIG. 18 illustrates a top-view structural schematic of a diode in a control unit according to embodiments of the present disclosure.

Optionally, FIG. 18 illustrates a top-view structural schematic of a diode in a control unit according to embodiments of the present disclosure. FIG. 18 illustrates the diode semiconductor layer DIw which may include the first electrode contact region C1, the second electrode contact region C2 and the connecting region L. The diode semiconductor layer DIw may be made by a material including a polysilicon material, that is, Poly-Si. The first electrode contact region C1 may be doped with boron, and the second electrode contact region C2 may be doped with phosphorus. The connecting region L may further include a doped channel region CHD and an intrinsic region LN. The doped channel region CHD may be doped with boron, and the boron doping concentration of the doped channel region CHD may be less than the boron doping concentration of the first electrode contact region C1. Optionally, the boron doping level of the doped channel region may be E11~13; the boron doping level of the first electrode contact region C1 may be E13~15; and the phosphorus doping level of the second electrode contact C2 region may be E13~15. In a direction z which is from the first electrode contact region C1 to the second electrode contact region C2, the first electrode contact region C1, the doped channel region CHD, the intrinsic region LN and the second electrode contact region C2 may be arranged sequentially. The arrangement may be advantageous to eliminate the Schottky barrier and improve the conduction performance of the diode. Meanwhile, the first electrode contact region and the second electrode contact region, which are configured with the above-mentioned arrangement, may be in the diode semiconductor layer, that is, in the same film layer structure. Compared with the overlapping arrangement of the first electrode contact region and the second electrode contact region in the direction perpendicular to the display panel, the above-mentioned arrangement may be advantageous to reduce the thickness of the film layer of the display panel.

Referring to FIG. 18, the length of the connecting region L is d3 in the direction z from the first electrode contact region C1 to the second electrode contact region C2. The width of the connecting region is d4 in a direction perpendicular to the direction z. A width to length ratio of the connecting region of the diode is n, where $n=d4/d3$ and $n \geq 10$. The on-current of the diode may be related to the width to length ratio of the connecting region. In the present disclosure, the width to length ratio of the connecting region may be set to $m \geq 10$, that is, the width to length ratio may be relatively large, which may ensure a large on-current provided by the diode. Therefore, it may ensure that the relatively large current may be provided to the heating element of the display unit, and the heating element may be ensured to be rapidly heated. Furthermore, heat may be rapidly transferred to the phase change material layer, ensuring the switching speed between the different reflective indexes of the phase change material layer and avoiding the switching delay, which may improve the display effect of the display panel.

In some optional embodiments, a number of the blocking metal wires may be one or more. In the diode semiconductor layer in the diode: the first electrode contact regions and the second electrode regions may be arranged alternatively in the third direction; a total number of the first electrode contact regions and the second electrode contact regions may be v; a number of the connecting regions may be v−1; and the number of the blocking metal wires overlapping the connecting regions of the same diode may be v−1. When v=3, the number of the connecting regions may be 2, and the number of the blocking metal wires overlapping the connecting regions of the same diode may be 2. When v=4, the number of the connecting regions may be 3, and the number of the blocking metal wires overlapping the connecting regions of the same diode may be 3.

Figure 19:
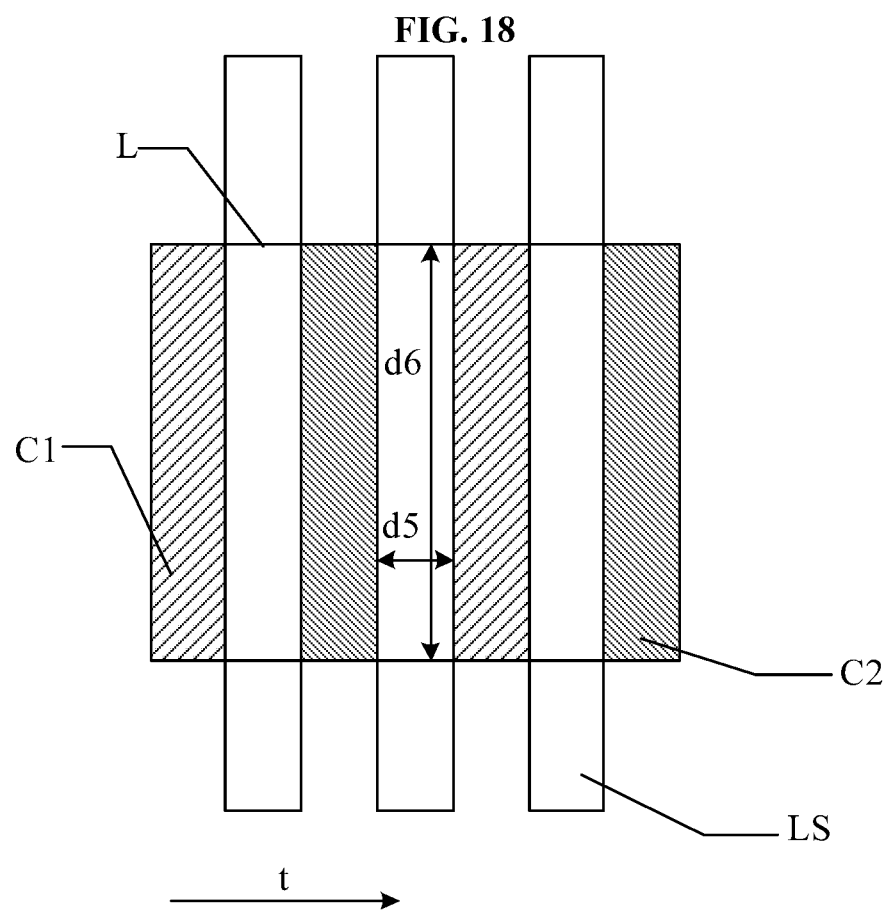
FIG. 19 illustrates a local top-view structural schematic of a display panel of another optional embodiment according to the present disclosure.

V=4 may be used as an example. FIG. 19 illustrates a local top-view structural schematic of a display panel of another optional embodiment according to the present disclosure. FIG. 19 illustrates the diode semiconductor layer DIw of a diode and the blocking metal wires LS overlapping the connecting regions L. The diode semiconductor layer DIw may include three connecting regions L, and the number of the blocking metal wires overlapping the connecting regions may be 3. The first electrode contact regions C1 and the second electrode contact regions C2 may be arranged alternatively in the third direction t. For example, the length of the connecting region L in the third direction t may be d5, and the length of the connecting region L in the direction perpendicular to the third direction t may be d6. In one embodiment, the region between the first electrode contact region C1 and the second electrode contact region C2 may be the connecting region L, which is equivalent to including three connecting regions L. In actual applications, the first electrode contact region C1 may be connected to a first electrode (not shown) and the second electrode contact region C2 may be connected to a second electrode (not shown). The width to length ratio of the connecting region of the diode $n=3*d6/d5$. The design method may be equivalent to partitioning the connecting region of the diode, which may implement the fabrication of the diode having a relatively large width to length ratio. Compared with the simple design method by increasing the width of the connecting region in one direction to implement the large width to length ratio, the design method provided by the present disclosure may greatly reduce the space occupied by a diode. Moreover, the diode with a relatively large width to length ratio may be fabricated to meet the requirement of rapidly supplying a large current to the heating element of the display unit. Furthermore, heat may be rapidly transferred to the phase change material layer, ensuring the switching speed between the different reflective indexes of the phase change material layer and avoiding the switching delay, which may improve the display effect of the display panel.

Figure 20:
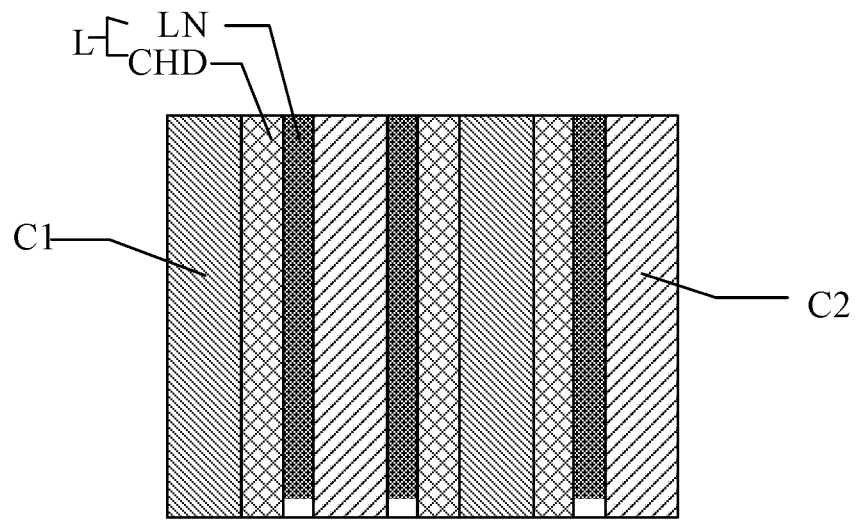
FIG. 20 illustrates a top-view structural schematic of a diode in FIG. 19.

Optionally, FIG. 20 illustrates a top-view structural schematic of a diode in FIG. 19. As shown in FIG. 20, in the direction from the first electrode contact region C1 to the second electrode contact region C2, the connecting region may include the doped channel regions CHD and the intrinsic regions LN which are arranged sequentially.

Figure 21:
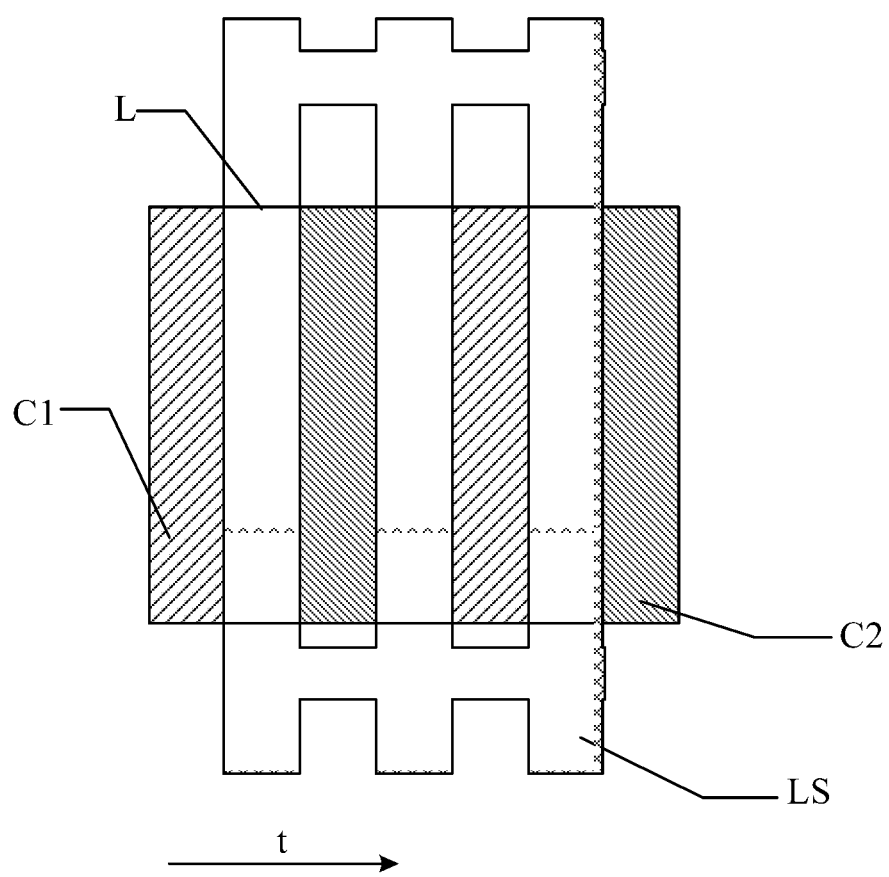
FIG. 21 illustrates a local top-view structural schematic of a display panel of another optional embodiment according to the present disclosure.

Furthermore, FIG. 21 illustrates a local top-view structural schematic of a display panel of another optional embodiment according to the present disclosure. As shown in FIG. 21, taking v=4 as an example, all the blocking metal wires LS overlapping the connecting regions L of the same diode may be connected to each other, and FIG. 21 may only illustrate the positions where the blocking metal wires may be connected to each other. In one embodiment, the blocking metal wires may be multiplexed into the circuit wire for transmitting signals and the number of the circuit wires disposed in the display panel may be reduced, which may be advantageous to save space occupied by the circuit wires in the display panel. The space saved may appropriately increase the number of pixels in the display panel, which may be advantageous to improve the display panel resolution. Furthermore, all the blocking metal wires overlapping the connecting regions of the same diode may be connected to each other, which may reduce the resistance of the entire blocking metal wires and may reduce the power consumption when the blocking metal wires are used for transmitting electronic signals.

Figure 22:
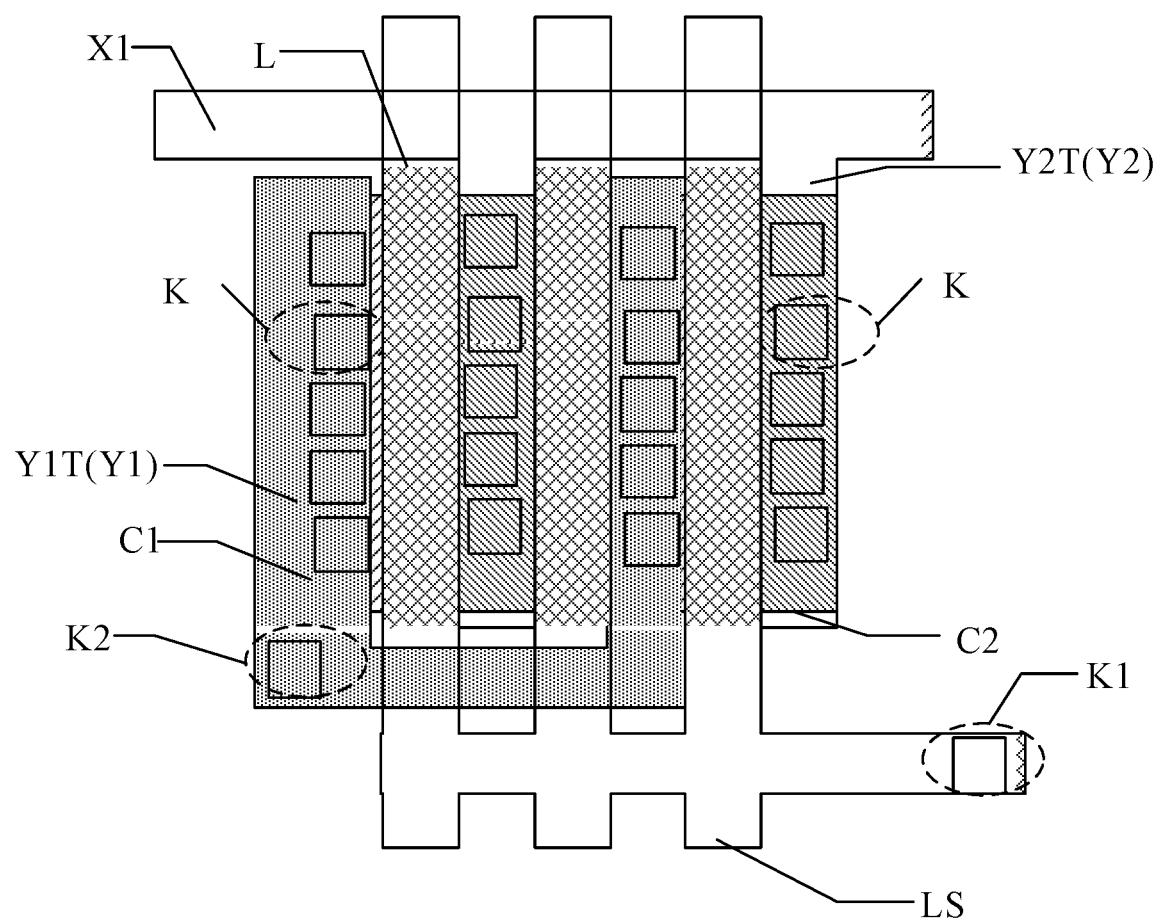
FIG. 22 illustrates a local top-view structural schematic of a display panel of another optional embodiment according to the present disclosure.

Furthermore, v=4 may be used as an example. FIG. 22 illustrates a local top-view structural schematic of a display panel of another optional embodiment according to the present disclosure. As shown in FIG. 22, the diode may further include the first electrode Y1 and the second electrode Y2. The first electrode Y1 may be electrically connected to the first electrode contact region C1, and the second electrode Y2 may be electrically connected to the second contact region C2. In an diode, the first electrode Y1 may include a first electrode strip Y1T and the second electrode Y2 may include a second electrode strip Y2T; the first electrode strips Y1T and the second strips Y2T may be alternatively arranged in the third direction t; in the direction perpendicular to the display panel, the first electrode strip Y1T and the first electrode contact region C1 may overlap and may be electrically connected through a plurality of vias K, and the second electrode strip Y2T and the second electrode contact region C2 may overlap and may be electrically connected through the plurality of vias K. The width to length ratio of the diode provided by the present disclosure may be relatively large, which may ensure a large on-current provided by the diode. Therefore, the requirement of rapidly supplying a large current to the heating element of the display unit may be satisfied. Furthermore, heat may be rapidly transferred to the phase change material layer, ensuring the switching speed between the different reflective indexes of the phase change material layer and avoiding the switching delay, which may improve the display effect of the display panel. Meanwhile, the blocking metal wire may be multiplexed into the circuit wire for transmitting signals and the number of the circuit wires disposed in the display panel may be reduced, which may be advantageous to save space occupied by the circuit wires in the display panel. The space saved may appropriately increase the number of pixels in the display panel, which may be advantageous to improve the display panel resolution. Furthermore, by setting the first electrode strip electrically connected to the first electrode contact region through the plurality of vias and the second electrode strip electrically connected to the second electrode contact region through the plurality of the vias, the design of the plurality of vias may ensure that the conduction performance between the first electrode strip and the first electrode contact region, and the conduction performance between the second electrode strip and the second electrode contact region, which may reduce the power consumption.

It should be noted that the blocking metal wire LS, which may be electrically connected to each of the second connecting terminal and the second signal source, may be used as an example in FIG. 22 for description (referring to FIG. 7 and FIG. 8). As shown in FIG. 22, the second electrode Y2 may be electrically connected to the blocking metal wire LS, which is overlapped with and insulated from the connecting region of the same diode. The blocking metal wire LS may be further connected to the second connecting terminal (e.g., 11D2 in FIG. 7) of the heating element through the first vias K1. The first electrode Y1 may be connected the first connecting terminal (e.g., 11D1 in FIG. 7) of the heating element through the second vias K2. That is, the blocking metal wire LS may be multiplexed into the second signal line for transmitting the second signal, and the first signal line X1 for transmitting the first signal may be electrically connected to the second electrode Y2. In addition, the blocking metal wire LS, which may be electrically connected to each of the first signal terminal and the first signal source, may not be described in detail herein.

Figure 23:
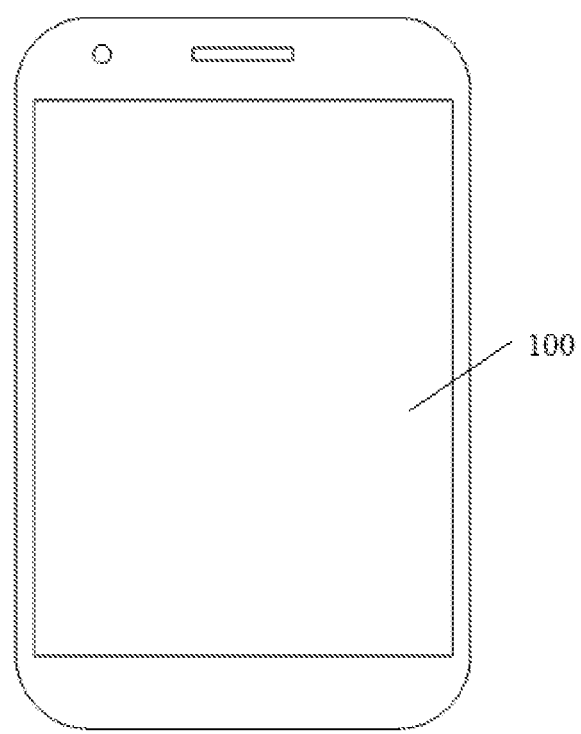
FIG. 23 illustrates a structural schematic of an exemplary display device according to embodiments of the present disclosure.

The present disclosure also provides a display device. FIG. 23 illustrates a structural schematic of an exemplary display device according to embodiments of the present disclosure. As shown in FIG. 23, the display device may include the display panel provided by the embodiments of the present disclosure. The display device provided by the embodiments of the present disclosure may be a display device having a display function, including but not limited to the following categories: televisions, notebook computers, desktop displays, tablet computers, digital cameras, mobile phones, smart bracelets, smart glasses, in-vehicle displays, medical equipment, industrial equipment, touch interactive terminals, etc.

From the above-mentioned embodiments, it can be seen that the display panel and the display device provided by the present disclosure achieve at least the following beneficial effects.

The display panel provided by the present disclosure may include the blocking metal wire. The blocking metal wire, which is overlapped with and insulated from the connecting region, may be fabricated to ensure that the connecting region of the diode may not be affected by the doping process. In the present disclosure, the blocking metal wire may be electrically connected to each of the first signal terminal and the first signal source, or the blocking metal wire may be electrically connected to each of the second connecting terminal and the second signal source. The blocking metal wire may be multiplexed into the circuit wire for transmitting signals and a number of the circuit wires disposed in the display panel may be reduced, which may be advantageous to save space occupied by the circuit wires in the display panel. The space saved may appropriately increase the number of pixels in the display panel, which may be advantageous to improve the display panel resolution. Moreover, it may be only needed to adjust the design of a patterned template during the fabrication to implement the use of the blocking metal wire as the circuit wire for transmitting signals, where the process may be relatively simple.

The details of the present disclosure have been described through the embodiments provided above. However, those skilled in the art should understand that the disclosed embodiments are exemplary only and are not intended to limit the scope of the present disclosure. Those skilled in the art should understand that the disclosed embodiments can be modified according to the scope and principles of the present disclosure. The scope of the present disclosure is defined by the appended claims and their equivalents.

What is claimed is:

1. A display panel, comprising:
   a plurality of pixels, and
   a blocking metal wire,
   wherein:
     a pixel of the plurality of pixels includes a display unit and a control unit driving the display unit, the display unit at least includes a heating element and a phase change material layer over the heating element, and the control unit is disposed under the display unit and over a substrate;
     the heating element includes a first connecting terminal and a second connecting terminal;
     the control unit includes a first signal terminal and a second signal terminal;
     the first signal terminal is electrically connected to a first signal source, the second signal terminal is electrically connected to the first connecting terminal, and the second connecting terminal is electrically connected to a second signal source;
     the control unit includes at least one diode, and the diode includes a diode semiconductor layer including a first electrode contact region, a second electrode contact region and a connecting region between the first electrode contact region and the second electrode contact region;
     the blocking metal wire is disposed on a side of the at least one diode away from the substrate and covers the connecting region in a direction perpendicular to the display panel and is insulated from the connecting region; and
     the blocking metal wire is electrically connected to each of the first signal terminal and the first signal source, or the blocking metal wire is electrically connected to each of the second connecting terminal and the second signal source.

2. The display panel according to claim 1, wherein:
   one end of the diode is the first signal terminal and another end is the second signal terminal.

3. The display panel according to claim 1, wherein:
   the plurality of the pixels is arranged in a first direction as a pixel row, and the plurality of the pixels is arranged in a second direction as a pixel column, wherein the first direction intersects the second direction;
   the blocking metal wire extends along the first direction, and control units of the plurality of the pixels in a same pixel row are electrically connected to a same blocking metal wire; and
   the display panel further includes second signal lines extending in the second direction, and second connecting terminals of heating elements of the plurality of the pixels in a same pixel column are electrically connected to a same second signal line.

4. The display panel according to claim 1, wherein:
   the plurality of the pixels is arranged in a first direction as a pixel row, and the plurality of the pixels is arranged in a second direction as a pixel column, wherein the first direction intersects the second direction;
   the display panel further includes first signal lines extending in the first direction, and control units of the plurality of the pixels in a same pixel row are electrically connected to a same first signal line; and
   the blocking metal wire extends along the second direction, and second connecting terminals of heating elements of the plurality of the pixels in a same pixel column are electrically connected to a same blocking metal wire.

5. The display panel according to claim 1, further including switch units, wherein:
   the switch units include first switch units and second switch units;
   a control terminal of a first switch unit is electrically connected to a first switch signal source;
   a first terminal of the first switch unit is electrically connected to the first signal terminal;
   a second terminal of the first switch unit is electrically connected to the first signal source;
   a control terminal of a second switch unit is electrically connected to a second switch signal source;
   a first terminal of the second switch unit is electrically connected to the second connecting terminal; and
   a second terminal of the second switch unit is electrically connected to the second signal source.

6. The display panel according to claim 5, wherein:
   each switch unit includes at least one switch transistor, wherein the switch transistor includes a transistor semiconductor layer over the substrate, a gate on a side of the transistor semiconductor layer away from the substrate, and a source and a drain on a side of the gate away from the transistor semiconductor layer;
   the diode further includes a first electrode and a second electrode, wherein the first electrode is electrically connected to the first electrode contact region, the second electrode is electrically connected to the second electrode contact region, and the first electrode and the second electrode are on a side of the diode semiconductor layer away from the substrate; and
   in at least one switch transistor, the transistor semiconductor layer and the diode semiconductor layer are in a same film layer; the first electrode, the second electrode, the source and the drain are in a same film layer; and the blocking metal wire and the gate are in a same film layer.

7. The display panel according to claim 6, wherein:
   a width to length ratio of a channel region of the switch transistor is m≥10.

8. The display panel according to claim 5, wherein:
   the plurality of the pixels is arranged in a first direction as a pixel row, and the plurality of the pixels is arranged in a second direction as a pixel column, wherein the first direction intersects the second direction;

the first signal terminals of the control units of the plurality of the pixels in a same pixel row are electrically connected to a same first switch unit; and the second connecting terminals of the heating elements of the plurality of the pixels at a same pixel column are electrically connected to a same second switch unit.

9. The display panel according to claim 8, further including control lines and signal buses wherein:

the control lines include first control lines and second control lines, and the signal buses include row signal buses and column signal buses;

the control terminal of the first switch unit is connected to a first control line of the first control lines, and the second terminal of the first switch unit is connected to a row signal bus of the row signal buses; and the control terminal of the second switch unit is connected to a second control line of the second control lines, and the second terminal of the second switch unit is connected to a column signal bus of the column signal buses.

10. The display panel according to claim 9, wherein:

the second terminals of all the first switch units are connected to a same row signal bus, and the second terminals of all the second switch units are connected to a same column signal bus.

11. The display panel according to claim 9, wherein:

the control terminal of each first switch unit is connected to a different first control line and the control terminal of each second switch unit is connected to a different second control line.

12. The display panel according to claim 1, wherein:

the diode semiconductor layer is made by a material including an intrinsic polycrystalline silicon material, wherein:

the first electrode contact region is doped with boron, and the second electrode contact region is doped with phosphorus; the connecting region further includes a doped channel region and an intrinsic region; the doped channel region is doped with boron; and a boron doping concentration of the doped channel region is less than a boron doping concentration of the first electrode contact region; and in a direction from the first electrode contact region to the second electrode contact region, the first electrode contact region, the doped channel region, the intrinsic region and the second electrode contact region are arranged sequentially.

13. The display panel according to claim 1, wherein:

a width to length ratio of the connecting region of the diode is n≥10.

14. The display panel according to claim 1, further comprising:

a plurality of the first electrode contact regions, a plurality of the second electrode contact regions, a plurality of the connecting regions, and a plurality of the blocking metal wires, wherein:

in the diode semiconductor layer of one diode, the plurality of the first electrode contact regions and the plurality of the second electrode contact regions are arranged alternatively in a third direction; a total number of the plurality of the first electrode contact regions and the plurality of the second electrode contact regions is v; and a number of the plurality of the connecting regions is v−1; and a number of the plurality of the blocking metal wires overlapping the plurality of the connecting regions of the diode is v−1.

15. The display panel according to claim 14, wherein:

all the plurality of the blocking metal wires overlapping the plurality of the connecting regions of the diode are connected to each other.

16. The display panel according to claim 14, wherein:

the diode further includes a first electrode and a second electrode, wherein the first electrode is electrically connected to the first electrode contact region, and the second electrode is electrically connected to the second electrode contact region; and in the diode, the first electrode includes a first electrode strip and the second electrode includes a second electrode strip; and in the direction perpendicular to the display panel, the first electrode strip and the first electrode contact region overlap and are electrically connected through a plurality of vias, and the second electrode strip and the second electrode contact region overlap and are electrically connected through the plurality of vias.

17. The display panel according to claim 1, wherein:

the display unit further includes a reflective layer and a spacer layer, wherein the reflective layer and the spacer layer together are between the heating element and the phase change material layer, and the spacer layer is on a side of the reflective layer away from the heating element.

18. A display device, comprising:

a display panel, comprising:

a plurality of pixels, and a blocking metal wire, wherein:

a pixel of the plurality of pixels includes a display unit and a control unit driving the display unit, the display unit at least includes a heating element and a phase change material layer over the heating element, and the control unit is disposed under the display unit and over a substrate;

the heating element includes a first connecting terminal and a second connecting terminal;

the control unit includes a first signal terminal and a second signal terminal;

the first signal terminal is electrically connected to a first signal source, the second signal terminal is electrically connected to the first connecting terminal, and the second connecting terminal is electrically connected to a second signal source;

the control unit includes at least one diode, and the diode includes a diode semiconductor layer including a first electrode contact region, a second electrode contact region and a connecting region between the first electrode contact region and the second electrode contact region;

the blocking metal wire is disposed on a side of the at least one diode away from the substrate and covers the connecting region in a direction perpendicular to the display panel and is insulated from the connecting region; and the blocking metal wire is electrically connected to each of the first signal terminal and the first signal source, or the blocking metal wire is electrically connected to each of the second connecting terminal and the second signal source.

* * * * *